United States Patent
Hayashi et al.

(10) Patent No.: US 9,378,775 B2
(45) Date of Patent: Jun. 28, 2016

(54) SEMICONDUCTOR DEVICE INCLUDING PLURAL CHIPS STACKED TO EACH OTHER

(75) Inventors: Junichi Hayashi, Tokyo (JP); Homare Sato, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 110 days.

(21) Appl. No.: 13/358,448

(22) Filed: Jan. 25, 2012

(65) Prior Publication Data

US 2012/0195090 A1  Aug. 2, 2012

(30) Foreign Application Priority Data

Jan. 28, 2011  (JP) .................................. 2011-016002

(51) Int. Cl.
| | | |
|---|---|---|
| *G11C 5/00* | (2006.01) | |
| *G11C 7/00* | (2006.01) | |
| *G11C 8/00* | (2006.01) | |
| *G11C 5/06* | (2006.01) | |
| *G11C 5/02* | (2006.01) | |

(52) U.S. Cl.
CPC . *G11C 5/063* (2013.01); *G11C 5/02* (2013.01)

(58) Field of Classification Search
USPC ........ 365/51, 230.03, 52, 63, 189.05, 189.07, 365/194, 203, 226, 230.06, 233.1
See application file for complete search history.

(56) References Cited

U.S. PATENT DOCUMENTS

| | | | | |
|---|---|---|---|---|
| 7,466,577 | B2 * | 12/2008 | Sekiguchi et al. | ............... 365/51 |
| 7,489,030 | B2 | 2/2009 | Shibata et al. | |
| 7,633,785 | B2 * | 12/2009 | Kim et al. | ........................ 365/51 |
| 7,894,231 | B2 | 2/2011 | Kim et al. | |
| 7,894,293 | B2 * | 2/2011 | Ikeda et al. | ............... 365/230.03 |
| 8,054,663 | B2 * | 11/2011 | Chung | ............... 365/51 |
| 8,213,205 | B2 * | 7/2012 | Rajan | ............... 365/51 |
| 8,274,847 | B2 * | 9/2012 | Yoko | ............... 365/51 |
| 8,547,775 | B2 * | 10/2013 | Yoko | ........................ 365/230.03 |
| 2007/0132085 | A1 | 6/2007 | Shibata et al. | |
| 2010/0142244 | A1 | 6/2010 | Kim et al. | |

FOREIGN PATENT DOCUMENTS

| | | | |
|---|---|---|---|
| JP | 2004-327474 A | 11/2004 | |
| JP | 2005-122823 A | 5/2005 | |
| JP | 2006-277870 A | 10/2006 | |
| JP | 2007-158237 A | 6/2007 | |
| JP | 2010-134904 A | 6/2010 | |

* cited by examiner

*Primary Examiner* — Trong Phan
(74) *Attorney, Agent, or Firm* — Kunzler Law Group, PC

(57) ABSTRACT

Such a device is disclosed that includes first and second chips stacked to each other, and a third chip controlling the first and second chips, stacked on the first and second chips, and including first, second and third output circuits. The first output circuit supplies a first command signal to the first chip. The second output circuit supplies the first command signal to the second chip. The third output circuit supplies a second command signal to the first and second chips.

16 Claims, 23 Drawing Sheets

SEMICONDUCTOR DEVICE INCLUDING PLURAL CHIPS STACKED TO EACH OTHER

BACKGROUND OF THE INVENTION

1. Field of the Invention

The present invention relates to a semiconductor device, and more particularly to a semiconductor device in which a front-end unit having an interface function and a back-end unit including a memory core are integrated on separate semiconductor chips.

2. Description of Related Art

Semiconductor devices such as a DRAM (Dynamic Random Access Memory) are often used in a state where a plurality of the semiconductor devices are mounted on a module substrate. The modularized DRAMs are sometimes classified into a plurality of ranks that are exclusively selected by chip select signals (see Japanese Patent Application Laid-open No. 2010-134904). Because different ranks can be accessed independently of each other unless competition on a data bus does not occur, use efficiency of the data bus can be enhanced by classifying the DRAMs on the module into the plural ranks.

On the other hand, there has recently been proposed a technique in which a so-called front-end unit performing an interface with a memory controller and a back-end unit including a memory core are integrated on separate chips, and these chips are stacked to form a single semiconductor memory device (see Japanese Patent Application Laid-Open No. 2007-158237). According to this technique, in a core chip on which the back-end unit is integrated, a space that can be allocated to the memory core increases, whereby a storage capacity per 1 chip (per 1 core chip) can be increased. On the other hand, the interface chip on which the front-end unit is integrated can be manufactured by a process different from the process for the memory core, whereby a circuit can be formed with a high-speed transistor. Furthermore, plural core chips can be allocated to one interface chip, resulting in that a high-speed semiconductor memory device having extremely large capacity as a whole can be provided.

However, in the stacked semiconductor device, through silicon vias used to transmit commands are commonly connected between the plural core chips. Accordingly, when the plural stacked core chips are classified into plural ranks, a transfer interval of the commands on the through silicon vias is reduced and thus the commands may not be correctly transferred. To prevent this, an issuance interval of the commands needs to be extended to avoid competition of the commands also at the time of accesses to different ranks; however, use efficiency of the bus is lowered in this case.

SUMMARY

In one embodiment, there is provided a semiconductor device that includes: first and second chips stacked to each other; and a third chip controlling the first and second chips, stacked on the first and second chips, and including first, second and third output circuits. The first output circuit supplies a first command signal to the first chip. The second output circuit supplies the first command signal to the second chip. The third output circuit supplies a second command signal to the first and second chips.

In another embodiment, there is provided a semiconductor device that includes: a first chip configured to receive first and second chip select signals and an original command signal, and output both of first and second command signals, the first command signal being activated when both of the original command signal and the first chip select signal are activated, and the second command signal being activated when the original command signal and the second chip select signal are activated; and a plurality of chips stacked with one another on the first chip, the chips including second and third chips, the second chip being activated when receives an activated first command signal from the first chip, and the third chip being activated when receives an activated second command signal from the first chip.

BRIEF DESCRIPTION OF THE DRAWINGS

FIG. 8 is a schematic view for explaining an address allocation in LRA-2 system;

FIG. 9 is a schematic view for explaining an address allocation in LRA-3 system;

FIGS. 19A and 19B are circuit diagrams indicative of an embodiment of the chip-address generating circuit 42 shown in FIG. 11, wherein FIG. 19A shows a circuit 42a that generates a chip address SID at the time of a row access and FIG. 19B shows a circuit 42b that generates the chip address SID at the time of a column access;

DETAILED DESCRIPTION OF THE EMBODIMENTS

Preferred embodiments of the present invention will be explained below in detail with reference to the accompanying drawings.

Figure 1:
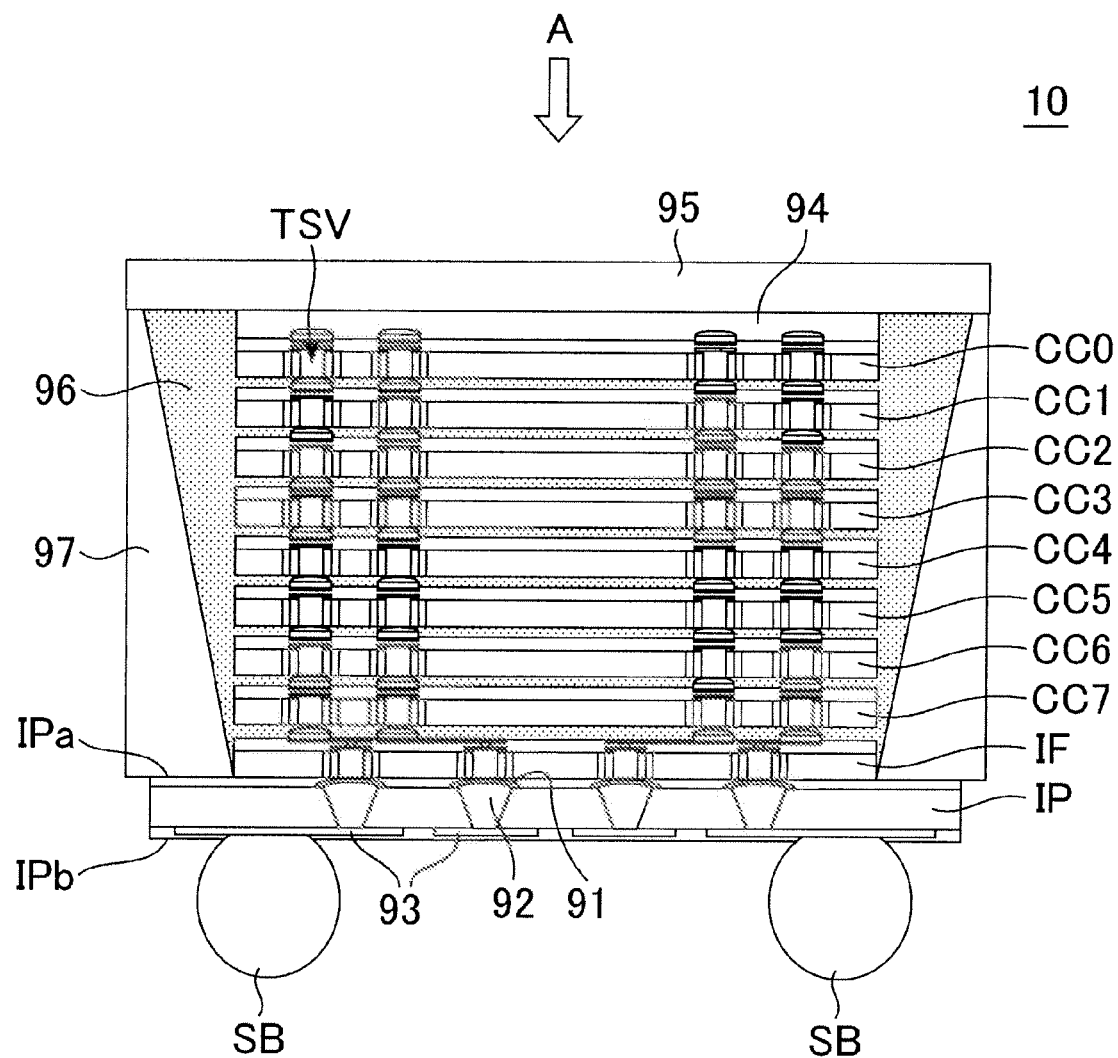
FIG. 1 is a schematic cross-sectional view for explaining a structure of a semiconductor device 10 according to an embodiment of the present invention.

Referring now to FIG. 1, the semiconductor device 10 according to this embodiment has the structure where eight core chips (memory chips) CC0 to CC7 and an interface chip IF are stacked on an interposer IP. The core chips CC0 to CC7 have the same function and structure as one another. It is worth noting that the uppermost core chip CC0 may have a different structure from the other core chips CC1 to CC7. For example, the uppermost core chip CC0 may be thicker than the remaining core chips CC1 to CC7. The core chips CC0 to CC7 are manufactured using the same manufacture mask whereas the interface chip IF is manufactured using a manufacture mask different from that of the core chips CC0 to CC7. The core chips CC0 to CC7 and the interface chip IF are semiconductor chips using a silicon substrate and are electrically connected to adjacent chips in a vertical direction through plural Through Silicon Vias (TSV) penetrating the silicon substrate. The through silicon vias may be referred to as penetration electrodes. The uppermost core chip CC0 may not have the through silicon via TSV. Meanwhile, the interposer IP is a circuit board that is made of a resin, and plural external terminals (solder balls) SB are formed in a back surface IPb of the interposer IP.

Each of the core chips CC0 to CC7 is a semiconductor chip on which only a back end unit of the circuit blocks included in the ordinary stand-alone SDRAM (Synchronous Dynamic Random Access Memory) is integrated. That is, each of the core chips CC0 to CC7 does not have a front end unit. As the circuit blocks included in the front end unit, a parallel-serial converting circuit that performs parallel/serial conversion on input/output data between a memory cell array and a data input/output terminal and a DLL (Delay Locked Loop) circuit that controls input/output timing of data are exemplified, which will be described in detail below.

On the other hand, the interface chip IF is a semiconductor chip on which only the front-end unit of the circuit blocks included in the normal stand-alone SDRAM is integrated. The interface chip IF functions as a common front end unit for the eight core chips CC0 to C07. Accordingly, all external accesses are performed through the interface chip IF and inputs/outputs of data are also performed through the interface chip IF.

In this embodiment, the interface chip IF is disposed between the interposer IP and the core chips CC0 to CC7. However, the position of the interface chip IF is not restricted in particular. The interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 2A:
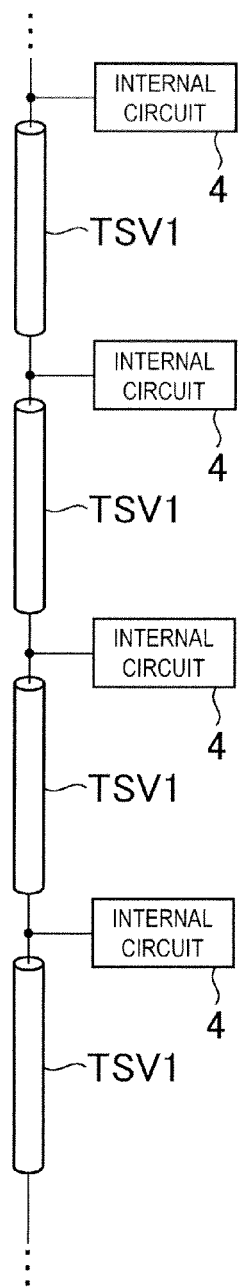
FIGS. 2A to 2C are diagrams indicative of an embodiment of various types of through silicon via TSV provided in a core chip.

When the through silicon vias TSV provided in the core chips CC0 to CC7 are two-dimensionally viewed from a lamination direction, that is, viewed from an arrow A shown in FIG. 1, most of the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 2B:
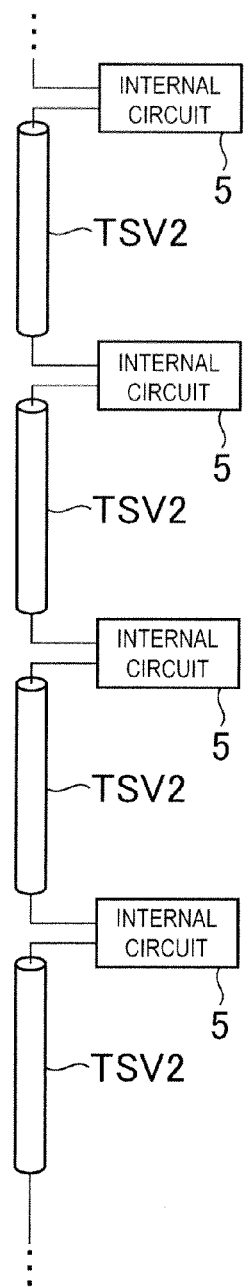

Meanwhile, as shown in FIG. 2B, a part of the through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, chip address information to be described below is exemplified.

Figure 2C:
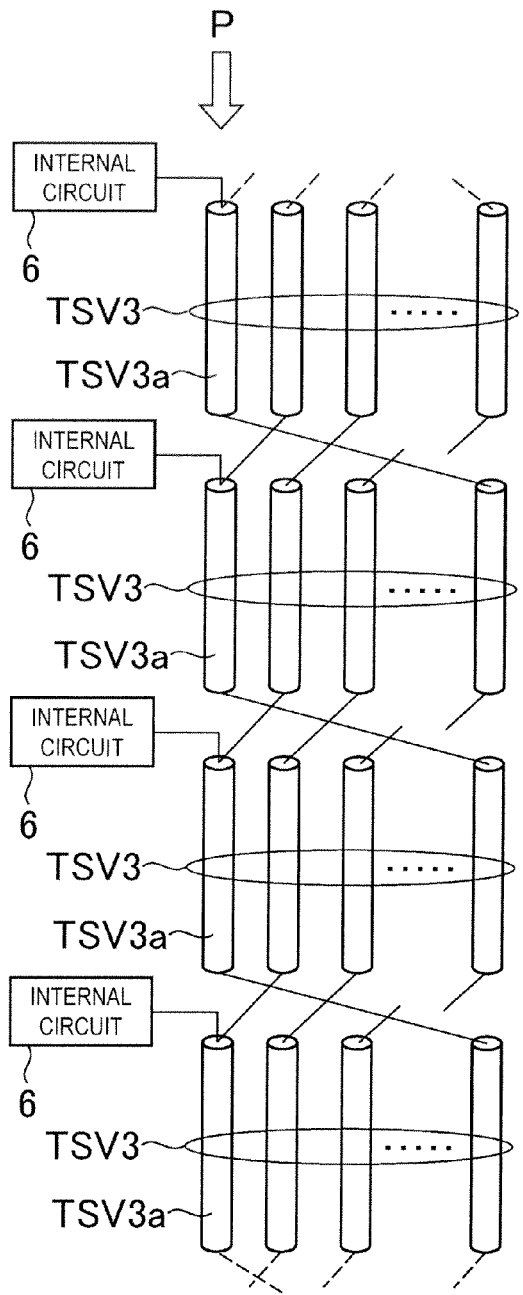

Another part of the through silicon vias TSV is short-circuited from the through silicon vias TSV of other layer provided at the different position in plain view, as shown in FIG. 2C. With respect to this kind of through silicon vias TSV group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information is exemplified.

As such, three types of through silicon vias TSV1 to TSV3 shown in FIGS. 2A to 2C are provided in the core chips CC0 to CC7. As described above, most of the through silicon vias TSV are of a type shown in FIG. 2A, and an address signal and a command signal, and the like are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 the types shown in FIGS. 2B and 2C are used to provide individual information to the core chips CC0 to CC7 whereas the core chips CC0 to CC7 have the same structure as one another.

Figure 3:
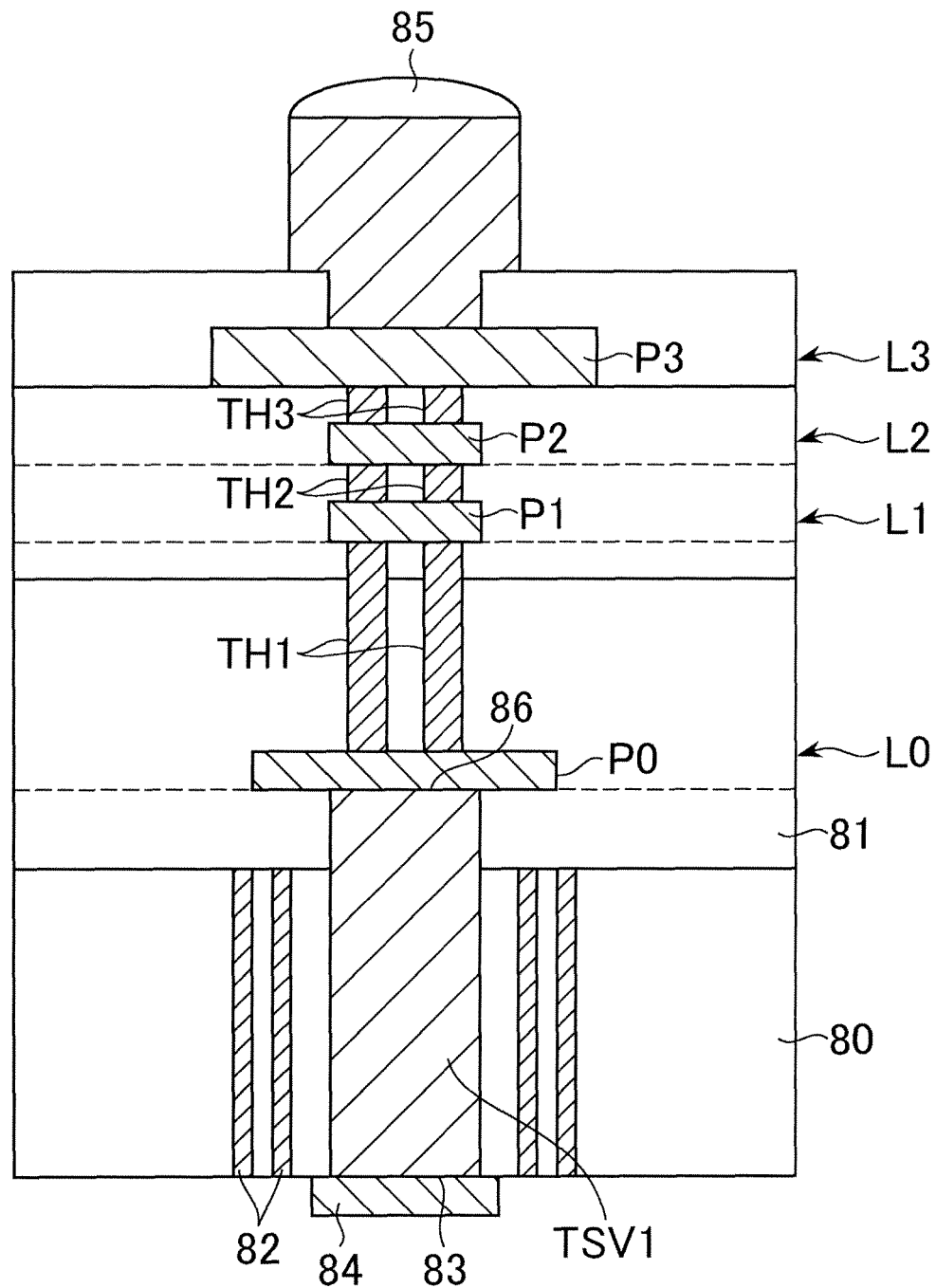
FIG. 3 is a cross-sectional view indicative of an embodiment of a structure of the through silicon via TSV1 of the type shown in FIG. 2A.

Turning to FIG. 3, the through silicon via TSV1 is provided to penetrate a silicon substrate 80 and an interlayer insulating film 81 provided on a surface of the silicon substrate 80. An insulating ring 82 is provided around the through silicon via TSV1. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads P0 to P3 provided in the wiring layers L0 to L3.

Figure 4:
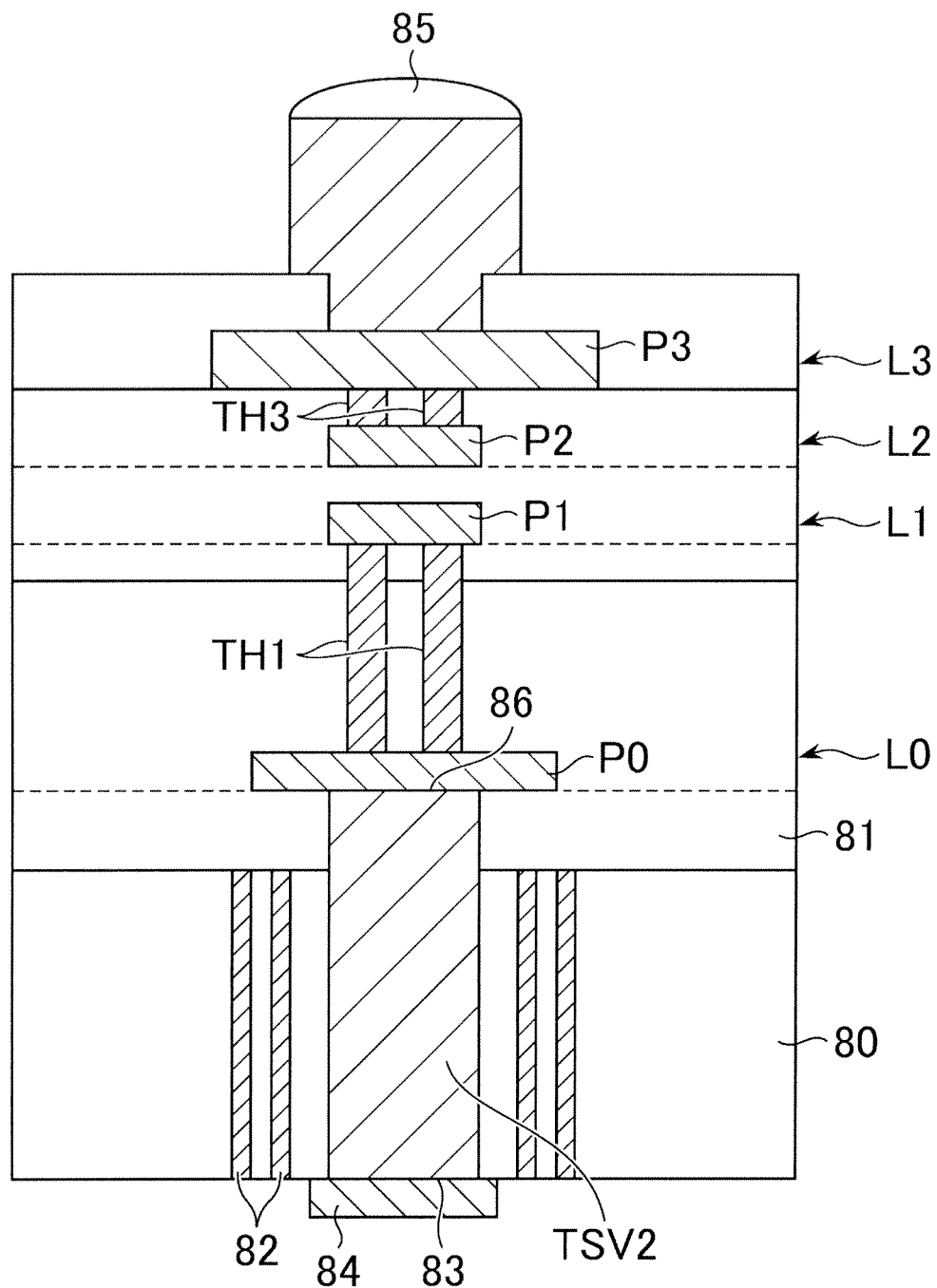
FIG. 4 is a cross-sectional view indicative of an embodiment of a structure of the through silicon via TSV2 of the type shown in FIG. 2B.

Turning to FIG. 4, the through silicon via TSV2 is different from the through silicon via TSV1 shown in FIG. 3 in that the through hole electrodes TH2 that directly connect the pads P1 and P2 located at the same plan position to each other are deleted. The pad P1 is connected to, for example, an output node of the internal circuit 5 shown in FIG. 2, and the pad P2 is connected to, for example, an input node of the internal circuit 5 shown in FIG. 2. This causes the respective internal circuits 5 provided in the core chips CC0 to CC7 to be cascaded through the through silicon vias TSV2.

Figure 5:
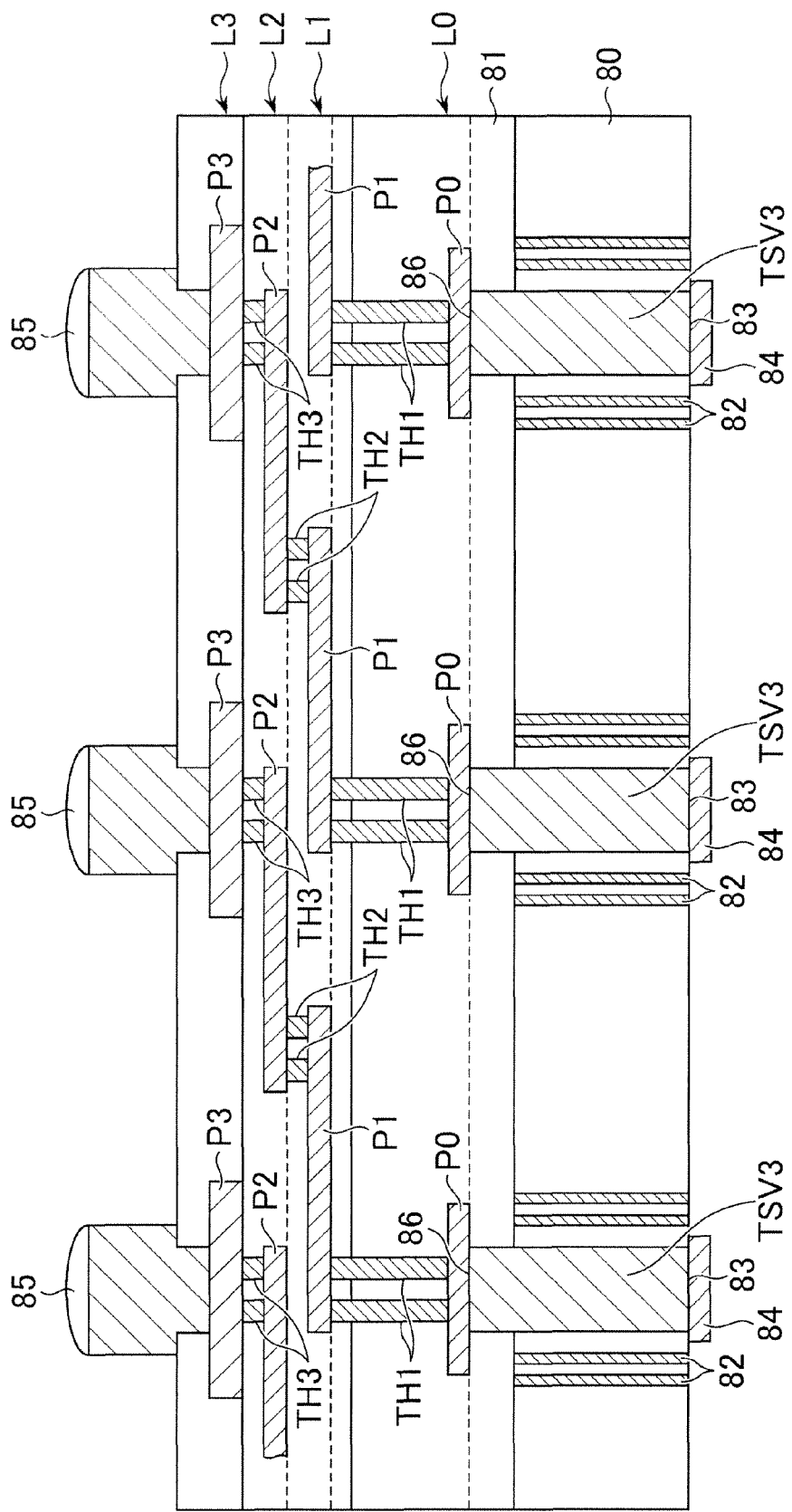
FIG. 5 is a cross-sectional view indicative of an embodiment of a structure of the through silicon via TSV3 of the type shown in FIG. 2C.
Figure 6:
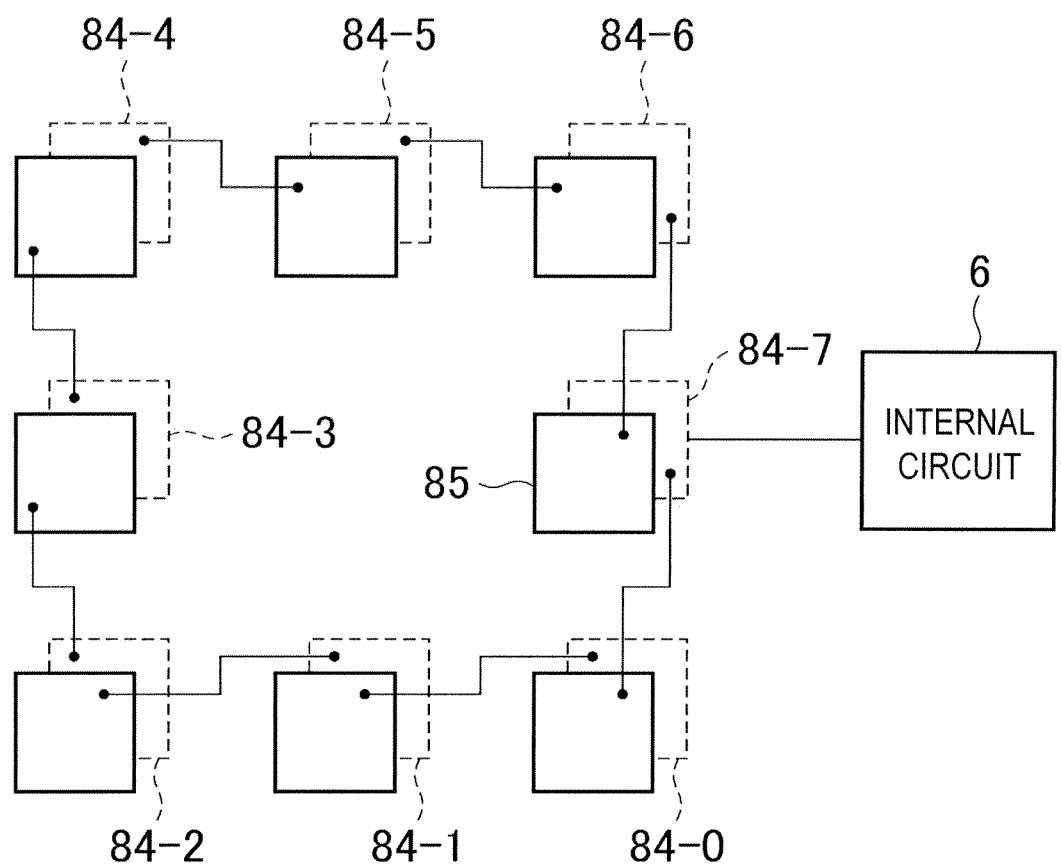
FIG. 6 is a schematic diagram for explaining a connection relation between through silicon vias TSV3 in respective core chips.

Turning to FIG. 5, in the through silicon vias TSV3, not the pads P1 and P2 located at the same plan position but the pads P1 and P2 located at different plan positions are connected by the though hole electrodes TH2. Although only three through silicon vias TSV3 are shown in FIG. 5, the through silicon vias TSV3 are provided in each of the core chips CC0 to CC7 by the number of core chips per signal (that is, eight). The eight through silicon vias TSV3 are connected cyclically as shown in FIG. 6. In FIG. 6, the front bumps 85 are shown by solid lines and the back bumps 84 are shown by broken lines.

When the through silicon vias TSV3 are connected cyclically as shown in FIG. 6, different information can be supplied to each of the core chips CC0 to CC7 from the interface chip IF while the core chips CC0 to CC7 have the same circuit configuration. For example, when the internal circuit 6 is connected at the position of the back bump 84-7, signals supplied from the interface chip IF to the back bumps 84-0 to 84-7 of the lowermost core chip CC7 are selectively supplied to the internal circuits 6 of the core chips CC0 to CC7, respectively.

Before detailed circuit structures of the interface chip IF and the core chips CC0 to CC7 are described, an address allocation in a semiconductor device 10 according to the present embodiment will be described.

The semiconductor device 10 according to the present embodiment can change the address allocation by a mode selection. There are roughly prepared an LRA (Logical Rank Address) system and a PRA (Physical Rank Address) system in the semiconductor device 10. The LRA system is an address allocation system in which plural physical banks mounted to the different core chips CC0 to CC7, respectively, are handled as one logical bank by a controller. On the other hand, the PRA system is an address allocation system in which each of the plural physical banks mounted to the respective core chips CC0 to CC7 is handled as one logical bank. In the present embodiment, there are three types in the LRA system. Each of three types is referred to as LRA-1 system, LRA-2 system, and LRA-3 system, for the sake of convenience. The respective systems will specifically be described below.

Turning to FIGS. 7 to 10, one square indicates a bank. Therefore, a single core chip includes banks 0 to 7.

Figure 7:
FIG. 7 is a schematic view for explaining an address allocation in LRA-1 system.

Referring to FIG. 7, in the LRA-1 system, any one of the core chips CC0 to CC7 is selected based upon a part of an address signal, which is $X_{n+2}$, $X_{n+1}$, and $X_n$ (chip address), supplied during a row-access (upon an issuance of an active command ACT), and any one of banks 0 to 7 is selected (example selections are encircled) based upon bank address signals BA0 to BA2 supplied during the row access and a column access. The controller recognizes 8 physical banks, included in the different core chips CC0 to CC7 and having the same number, as one logical bank.

In this system, the chip address is not supplied during the column access (upon the issuance of a column command). However, since the controller recognizes 8 physical banks, included in the different core chips CC0 to CC7 and having the same number, as one logical bank, the controller can identify to which one of the core chips CC0 to CC7 the column access is made during the column access, even if the chip address is not supplied. Because there is inevitably one core chip in which the logical bank designated upon the column access is in an active state.

For example, it is supposed that the encircled physical banks are in the active state in FIG. 7. If the designated logical bank upon the column access is the bank 0, the column access is made to the core chip CC7 in which the bank 0 is in the active state. If the designated logical bank upon the column access is the bank 1, the column access is made to the core chip CC5 in which the bank 1 is in the active state.

As described above, the selection of the core chips CC0 to CC7 is made during the row access in the LRA-1 system. The controller recognizes the core chips CC0 to CC7 as one DRAM, so that a chip selection signal (CS) to be used is also 1 bit. Therefore, the number of memory cells accessed by one row access becomes 1 kilobyte, and the number of the rank becomes 1.

Figure 8:
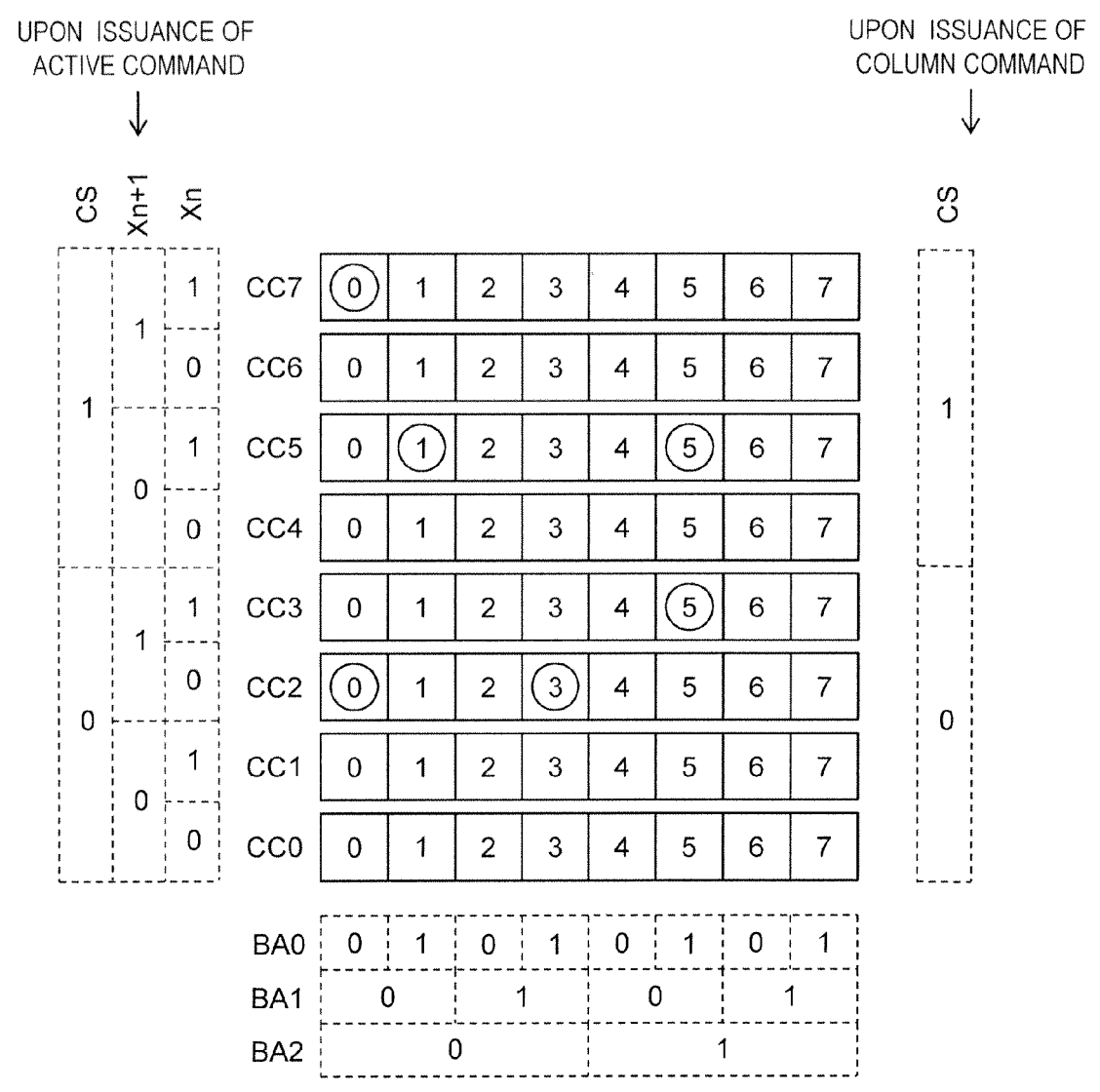

Turning to FIG. 8, in the LRA-2 system, the core chips CC0 to CC3 or the core chips CC4 to CC7 are selected based upon chip selection signals CS0B and CS1B of two bits, and any one of selected 4 core chips is selected based upon a part of an address signal, which is Xn+1, and Xn (chip address), supplied during a row-access. The bank address signals BA0 to BA2 are supplied during both the row access and the column access.

In this system, the core chips CC0 to CC3 or the core chips CC4 to CC7 are selected by using the chip selection signals, so that the rank number viewed from the controller becomes 2. Like the LRA-1 system, the selection of the core chips CC0 to CC7 is determined during the row access, so that the number of memory cells accessed by one row access becomes 1 kilobyte, as in the LRA-1 system. Although the chip address is not supplied during the column access, a problem is not caused with this situation, as in the LRA-1 system.

In this system, the core chips CC0 to CC3 and the core chips CC4 to CC7 are identified by the chip selection signals CS0B and CS1B. Therefore, the banks belonging to the core chips CC0 to CC3 and the banks belonging to the core chips CC4 to CC7 are handled as different logical banks by the controller. Accordingly, the bank 0 in the core chip CC2 and the bank 0 in the core chip CC7 can be simultaneously brought into the active state as in the example in FIG. 8.

Figure 9:
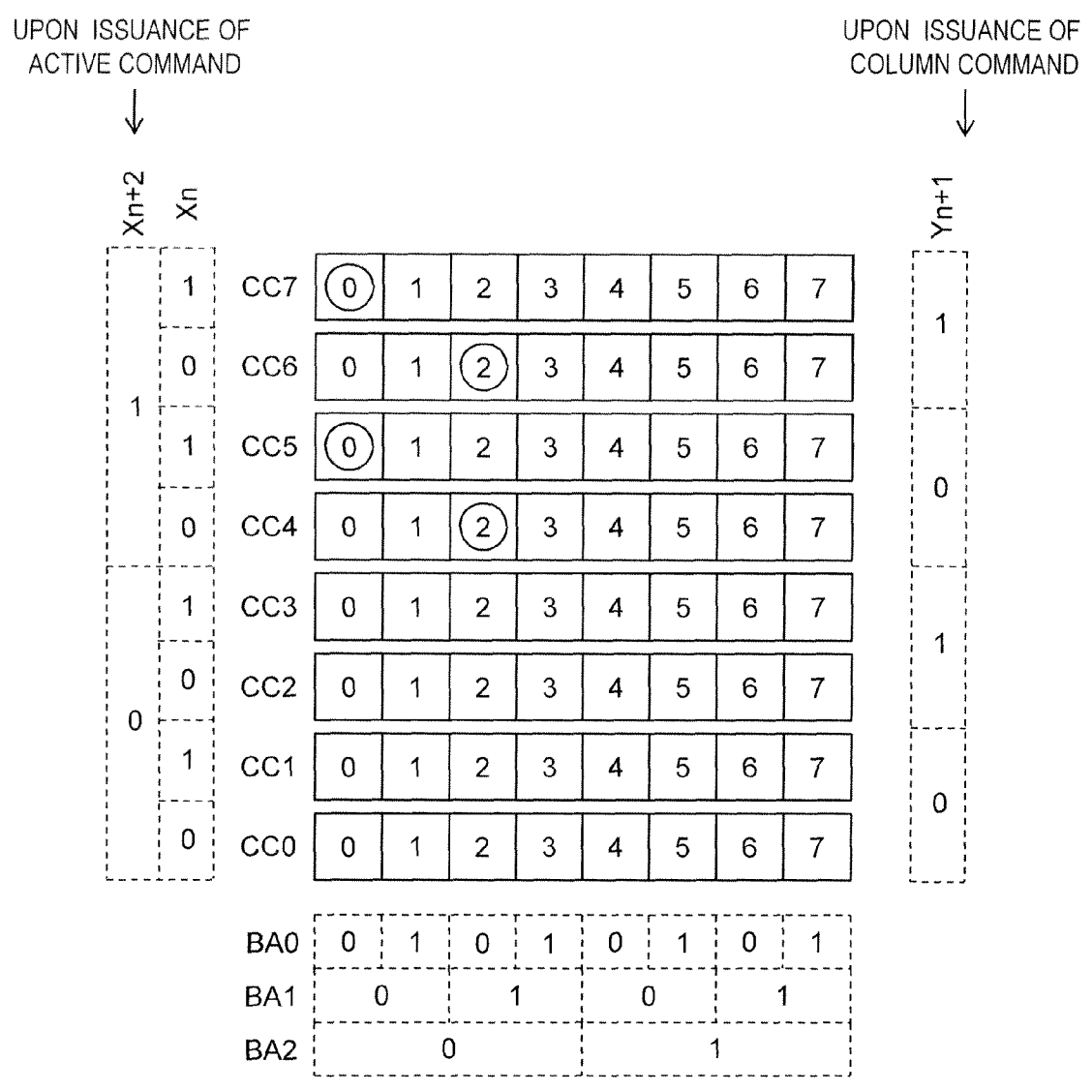

Turning to FIG. 9, in the LRA-3 system, any one set of the core chips CC0 and CC2, the core chips CC1 and CC3, the core chips CC4 and CC6, and the core chips CC5 and CC7 is selected based upon a part of the address signals, which is Xn+2 and Xn, supplied during the row access, and either one of the selected two core chips is selected based upon a part of the address signals, which is Yn+1, supplied during the column access. The bank address signals BA0 to BA2 are supplied during both the row access and the column access.

In this system, the selection of the core chips CC0 to CC7 is made based upon the part of the address signals, which is Xn+2 and Xn, supplied during the row access, and a part of the address signals, which is Yn+1, supplied during the column access. Therefore, the chip address becomes Xn+2, Xn, and Yn+1. Since two core chips are in the active state during the row access, the number of memory cells accessed by one row access becomes double that in the LRA-1 system and LRA-2 system. For example, it becomes 2 kilobytes. The rank number is 1, as in the LRA-1 system.

Figure 10:
FIG. 10 is a schematic view for explaining an address allocation in PRA system.
Figure 10:

Turning to FIG. 10, the PRA system is a system in which chip addresses P2, P1, and P0, which are a part of the address signal, and the bank address signals BA0 to BA2 are supplied during both the row access and the column access. In this system, the controller recognizes all physical banks as different logical banks. Specifically, the controller recognizes 64 banks in the present embodiment. Therefore, the number and the combination of the banks, which become the active state, is optional, wherein the maximum of 64 banks can be brought into the active state.

The above description is the detail of the respective address allocation systems. The address allocation systems can be changed by the mode selection.

A specific circuit configuration of the semiconductor device 10 is explained next. In the following explanation, the operation mode of the semiconductor device 10 is set to the PRA-2 system.

Figure 11:
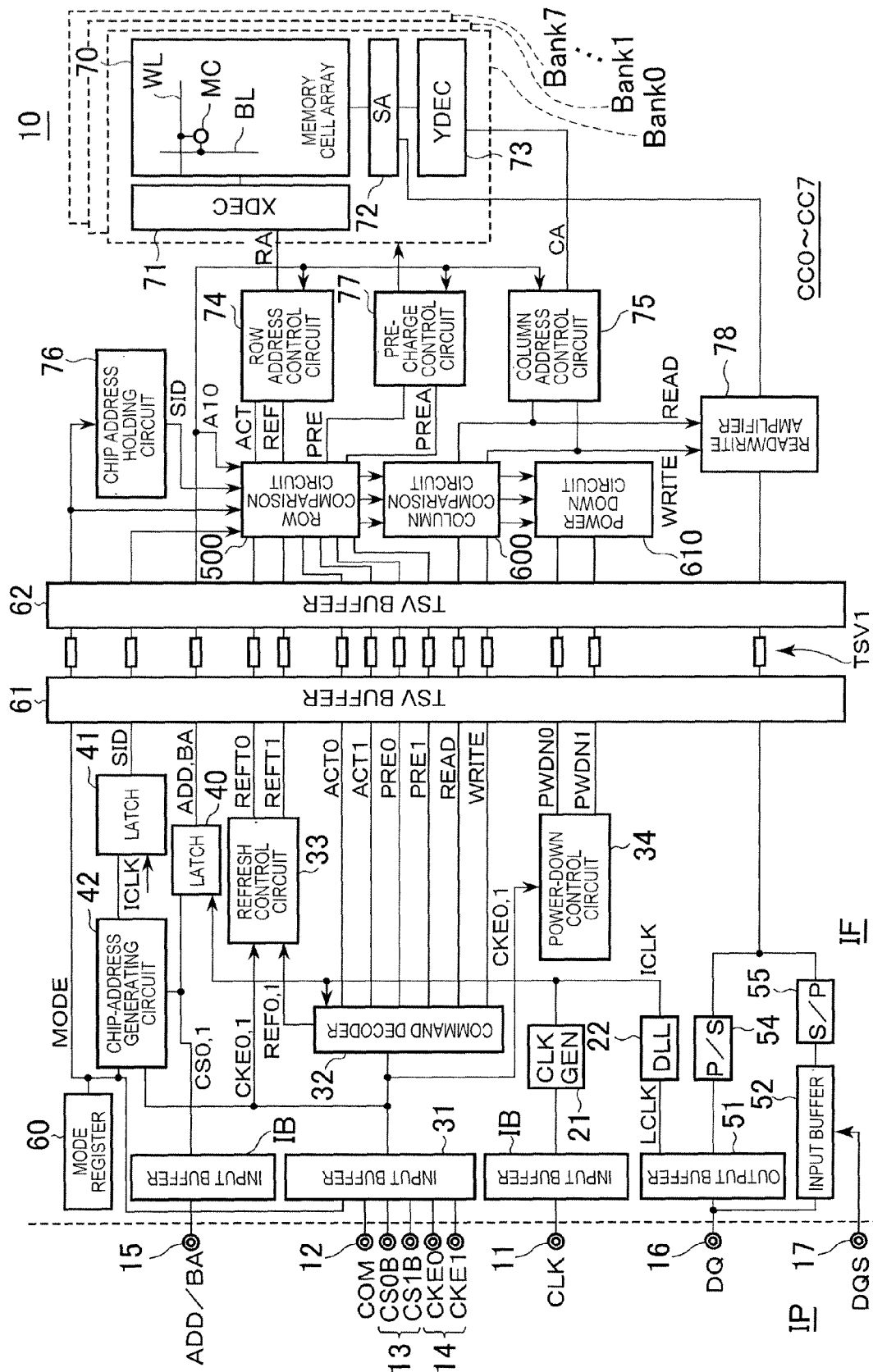
FIG. 11 is a block diagram indicative of an embodiment of a configuration of the semiconductor device 10 according to a first embodiment of the present invention.

Turning to FIG. 11, external terminals provided in the interposer IP include a clock terminal 11, a command terminal 12, chip select terminals 13, clock enable terminals 14, an address terminal (ADD/BA) 15, a data input/output terminal 16, and a data strobe terminal 17. Although other terminals such as a calibration terminal and a power supply terminal are also provided, they are not shown. All the external terminals other than the power supply terminal are connected to the interface chip IF and are not directly connected to the core chips CC0 to CC7.

The clock terminal 11 is supplied with an external clock signal CLK. The external clock signal CLK is supplied to a clock generation circuit 21 through an input buffer IB. The clock generation circuit 21 generates an internal clock signal ICLK. The internal clock signal ICLK is supplied to various circuit blocks in the interface chip IF.

The internal clock signal ICLK is supplied to a DLL circuit 22. The DLL circuit 22 generates an output clock signal LCLK. The output clock signal LCLK is supplied to an output buffer circuit 51.

The command terminal 12 is supplied with a command signal COM including a row address strobe signal RASB, a column address strobe signal CASB, a write enable signal WEB, and the like. The chip select terminal 13 is supplied with the chip selection signals CS0B and CS1B. The clock enable terminal 14 is supplied with clock enable signals CKE0 and CKE1. The command signal, the chip selection signals, and the clock enable signals are supplied to a command decoder 32 through an input buffer 31.

Figure 12:
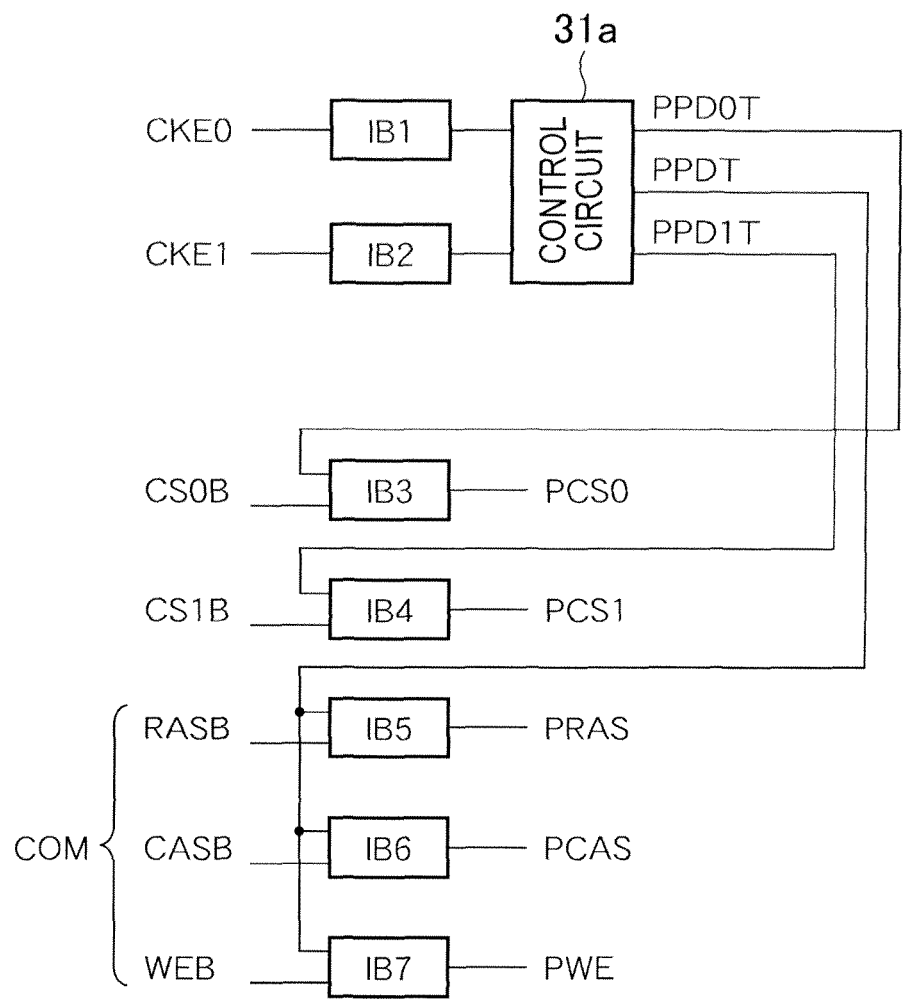
FIG. 12 is a circuit diagram indicative of an embodiment of an input buffer 31 shown in FIG. 11.

Turning to FIG. 12, the input buffer 31 includes input buffers IB1 to IB7 to which the clock enable signals CKE0 and CKE1, the chip select signals CS0B and CS1B, the row address strobe signal RASB, the column address strobe signal CASB, and the write enable signal WEB are input, respectively. The input buffer 31 further includes a control circuit 31a that receives the clock enable signals CKE0 and CKE1 having passed through the input buffers IB1 and IB2 and generates internal signals PPDT, PPD0T, and PPD1T based on the clock enable signals. The internal signals PPD0T and PPD1T are used as signals for activating the input buffers IB3 and IB4, respectively, and the internal signal PPDT is used as a signal for activating the input buffers IB5 to IB7.

The internal signals PPD0T and PPD1T are activated based on the clock enable signals CKE0 and CKE1, respectively. Accordingly, an output from the input buffer IB3 or IB4 corresponding to the chip select signal CS0B or CS1B in an inactive state is guarded against erroneous activation. The internal signal PPDT is activated when one of the clock enable signals CKE0 and CKE1 is activated. Accordingly, the input buffers IB5 to IB7 are activated when one of the clock enable signals CKE0 and CKE1 is activated. Commands signals PCS0, PCS1, PRAS, PCAS, and PWE having passed through the input buffers IB3 to IB7 are supplied to the command decoder 32 shown in FIG. 11.

The command decoder 32 decodes the command signals PCS0, PCS1, PRAS, PCAS, and PWE output from the input buffer 31 to generate various internal commands, and delays the generated internal commands based on a previously set latency. The internal commands output from the command decoder 32 are supplied to the core chips CC0 to CC7 through TSV buffers 61 and 62. The internal commands output from the command decoder 32 include active commands ACT0 and ACTT, precharge commands PRE0 and PRE1, a read command READ, and a write command WRITE.

Figure 13:
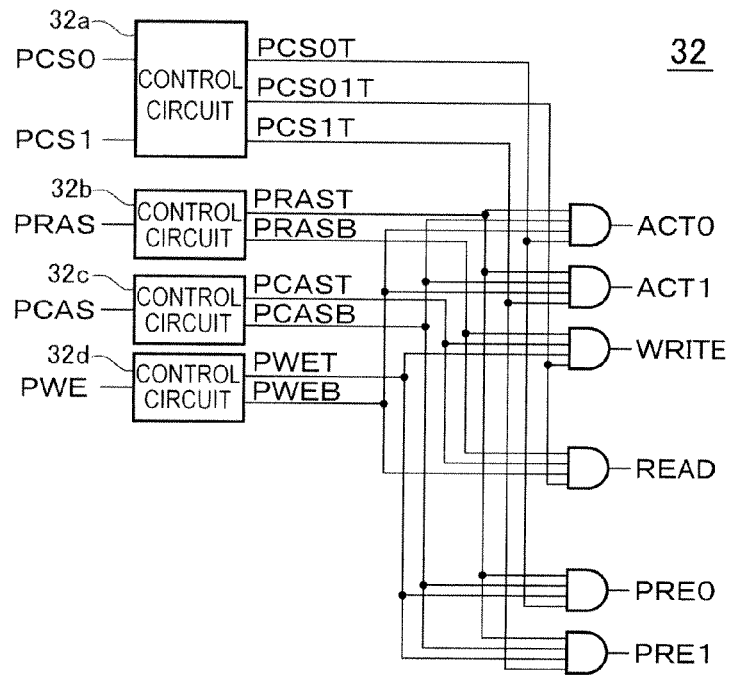
FIG. 13 is a circuit diagram indicative of an embodiment of main parts of a command detector 32 shown in FIG. 11.

Turning to FIG. 13, the command decoder 32 includes a control circuit 32a that generates internal signals PCS0T, PCS1T, and PCS01T based on the command signals PCS0 and PCS2, and control circuits 32b to 32d that generate complementary signals PRAST, PRSAB, PCAST, PCASB, PWET, and PWEB of the command signals PRAS, PCAS, and PWE based on these command signals, respectively. The control circuit 32a activates the internal signal PCS0T to a high level when the command signal PCS0 is activated, activates the internal signal PCS1T to a high level when the command signal PCS1 is activated, and activates the internal signal PCS01T to a high level when at least one of the command signals PCS0 and PCS1 is activated. These internal signals are input to corresponding AND gate circuits, and outputs thereof are used as the active commands ACT0 and ACT1, the precharge commands PRE0 and PRE1, the read command READ, and the write command WRITE.

The active command ACT0 is generated when a combination of the command signals PRAS, PCAS, and PWE indicates an active command and when the command signal PCS0 is activated. Similarly, the active command ACT1 is generated when a combination of the command signals PRAS, PCAS, and PWE indicates an active command and when the command signal PCS1 is activated. In this way, the active command ACT0 for a rank 0 and the active command ACT1 for a rank 1 are output from different command-signal output circuits. The rank 0 corresponds to the core chips CC0 to CC3 and the rank 1 corresponds to the core chips CC4 to CC7.

The precharge command PRE0 is generated when a combination of the command signals PRAS, PCAS, and PWE indicates a precharge command and when the command signal PCS0 is activated. Similarly, the precharge command PRE1 is generated when a combination of the command signals PRAS, PCAS, and PWE indicates a precharge command and when the command signal PCS1 is activated. In this way, the precharge command PRE0 for the rank 0 and the precharge command PRE1 for the rank 1 are also output from different command-signal output circuits.

The read command READ is generated when a combination of the command signals PRAS, PCAS, and PWE indicates a read command and when the command signal PCS0 or PCS1 is activated. The write command WRITE is generated when a combination of the command signals PRAS, PCAS, and PWE indicates a write command and when the command signal PCS0 or PCS1 is activated.

Among the commands ACT0, ACT1, PRE0, PRE1, READ, and WRITE, the read command READ and the write command WRITE are output from the command decoder 32 after a predetermined latency has elapsed in a latency counter (not shown). The latency for the read command READ and the write command WRITE is set to an additive latency AL. Values of the additive latency AL can be changed according to set values in a mode register 60.

The commands ACT0, ACT1, PRE0, PRE1, READ, and WRITE thus generated are supplied to the core chips CC0 to CC7 through the TSV buffers 61 and 62. As shown in FIG. 11, these commands ACT0, ACT1, PRE0, PRE1, READ, an WRITE are supplied to the core chips CC0 to CC7 in common through different through silicon vias TSV1. Therefore, row commands (ACT0, ACT1, PRE0, and PRE1) for the respective ranks are different signals and are supplied to the core chips CC0 to CC7 through separate through silicon vias TSV1. On the other hand, column commands (READ and WRITE) are signals common to the ranks and are supplied to the core chips CC0 to CC7 through the same through silicon via TSV1. However, this is limited only to the case where the semiconductor device 10 according to the first embodiment operates in the LRA-2 system and, when the semiconductor device 10 operates in other systems, the chip select signal CS1B is not used and thus the active command ACT1 and the precharge command PRE1 are not used.

Furthermore, although not shown in FIG. 13, the commands generated by the command decoder 32 also include refresh commands REF0 and REF1. The refresh command REF0 is generated when a combination of the command signals PRAS, PCAS, and PWE indicates a refresh command and when the command signal PCS0 is activated. Similarly, the refresh command REF1 is generated when a combination of the command signals PRAS, PCAS, and PWE indicates a refresh command and when the command signal PCS1 is activated.

The refresh commands REF0 and REF1 are supplied to a refresh control circuit 33 shown in FIG. 11. The refresh control circuit 33 generates refresh commands REFT0 and REFT1 based on the refresh commands REF0 and REF1 and the clock enable signals CKE0 and CKE1, respectively. The refresh command REFT0 is a signal corresponding to one of the ranks (the rank 0) like the active command ACT0 and the precharge command PRE0, and the refresh command REFT1 is a signal corresponding to the other rank (the rank 1) like the active command ACT1 and the precharge command PRE1.

As shown in FIG. 11, the refresh commands REFT0 and REFT1 are also supplied to the core chips CC0 to CC7 in common through different through silicon vias TSV1. However, when the semiconductor device operates in modes other than the LRA-2 system, the chip select signal CS1B is not used and accordingly the refresh command REFT1 is not used.

Figure 14:
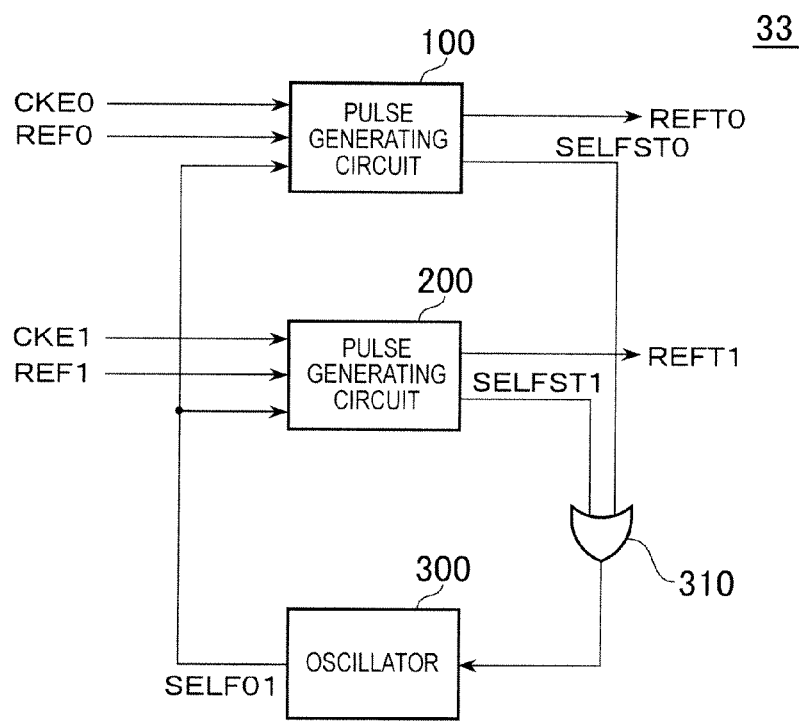
FIG. 14 is a circuit diagram indicative of an embodiment of a refresh control circuit 33 shown in FIG. 11.

Turning to FIG. 14, the refresh control circuit 33 includes a first pulse generating circuit 100, a second pulse generating circuit 200, and an oscillator 300. The first pulse generating circuit 100 and the second pulse generating circuit 200 have the same circuit configuration, and a self state signal SELFST0 output from the first pulse generating circuit 100 and a self state signal SELFST1 output from the second pulse generating circuit 200 are input to an OR gate circuit 310. An output of the OR gate circuit 310 is supplied to the oscillator 300 to control an operation thereof.

Figure 15:
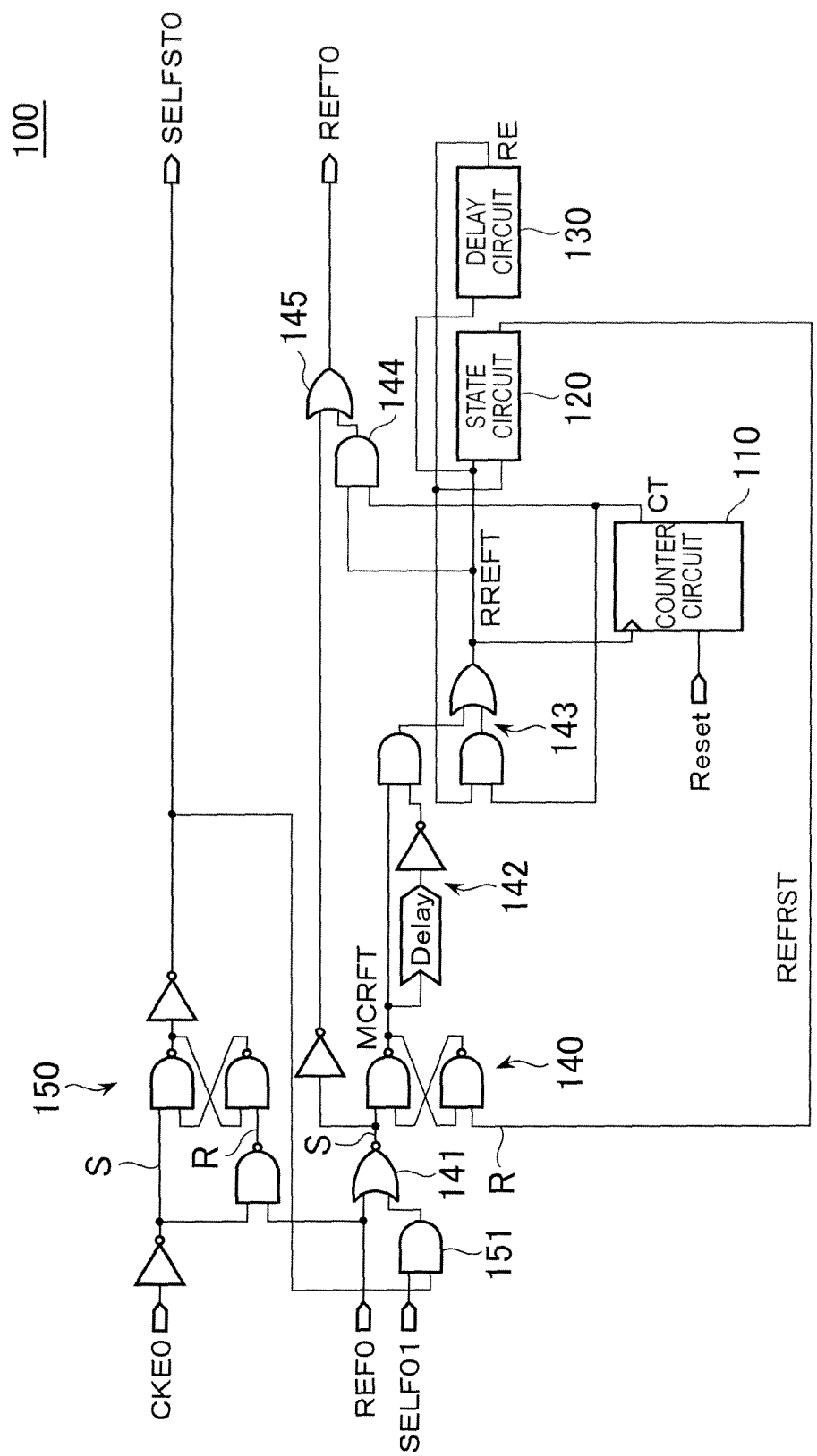
FIG. 15 is a circuit diagram indicative of an embodiment of a first pulse generating circuit 100 shown in FIG. 14.

Turning to FIG. 15, the first pulse generating circuit 100 includes a counter circuit 110, a state circuit 120, a delay circuit 130, and SR latch circuits 140 and 150. The refresh command REF0 is supplied to a set input terminal (S) of the SR latch circuit 140 through a NOR gate circuit 141. Accordingly, when the refresh command REF0 is activated to a high level, the SR latch circuit 140 is set.

An output (MCRFT) of the SR latch circuit 140 is supplied to a one-shot pulse generating circuit (Delay) 142 and a complex gate circuit 143. An internal signal RREFT which is an output from the complex gate circuit 413 is input to an AND gate circuit 144 together with a count signal CT which is an output from the counter circuit 110. An output of the AND gate circuit 144 is input to an OR gate circuit 145 together with an inverted output of the NOR gate circuit 141, and an output of the OR gate circuit 145 is used as the refresh command REFT0.

An inverted signal of the clock enable signal CKE0 is input to a set input terminal (S) of the SR latch circuit 150. Accordingly, the self state signal SELFST0 which is an output of the SR latch circuit 150 is activated to a high level when the clock enable signal CKE0 changes to a low level.

Figure 16:
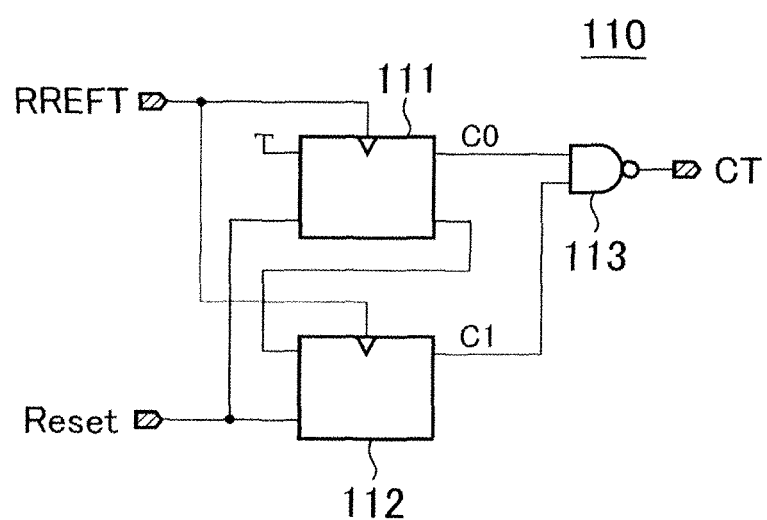
FIG. 16 is a circuit diagram indicative of an embodiment of a counter circuit 110 shown in FIG. 15.
Figure 17:
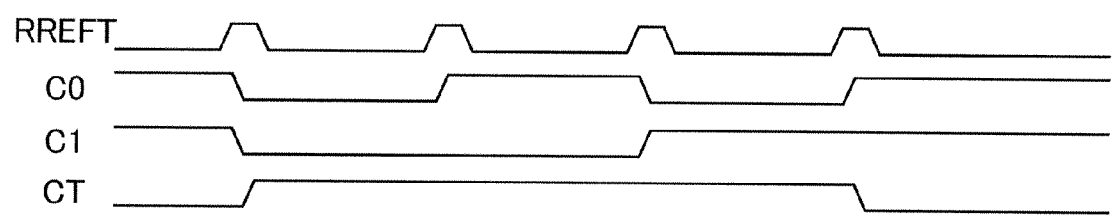
FIG. 17 is a timing chart for explaining an operation of the counter circuit 110 shown in FIG. 15.

Turning to FIG. 16, the counter circuit 110 includes two flip-flop circuits 111 and 112, and a NAND gate circuit 113 that receives output bits C0 and C1 of the flip-flop circuits 111 and 112. An internal signal RREFT is input to clock input terminals of the flip-flop circuits 111 and 112. The two flip-flop circuits 111 and 112 are cascaded as shown in FIG. 16 and therefore constitute a 2-bit binary counter. That is, as shown in FIG. 17, the output bit C0 of the flip-flop circuit 111 is inverted at each activation of the internal signal RREFT, and the output bit C1 of the flip-flop circuit 112 is inverted after every two activations of the internal signal RREFT. Therefore, the count signal CT which is at a low level in an initial state becomes a high level in response to the activation of the internal signal RREFT and returns to a low level in response to a fourth activation of the internal signal RREFT. The count values C0 and C1 of the counter circuit 110 are reset to zero (C0, C1=(0, 0)) in response to a reset signal Reset.

Turning to FIG. 15, the internal signal RREFT is also supplied to the state circuit 120 and the delay circuit 130. The state circuit 120 causes a refresh state signal REFRST to be at a high level for a certain period after the internal signal RREFT is activated. The refresh stat signal REFRST indicates that the device is in a refresh period and is supplied to a reset input terminal (R) of the SR latch circuit 140. The delay circuit 130 generates a delay signal RE by delaying the internal signal RREFT. The delay signal RE is supplied to the complex gate circuit 143.

Figure 18:
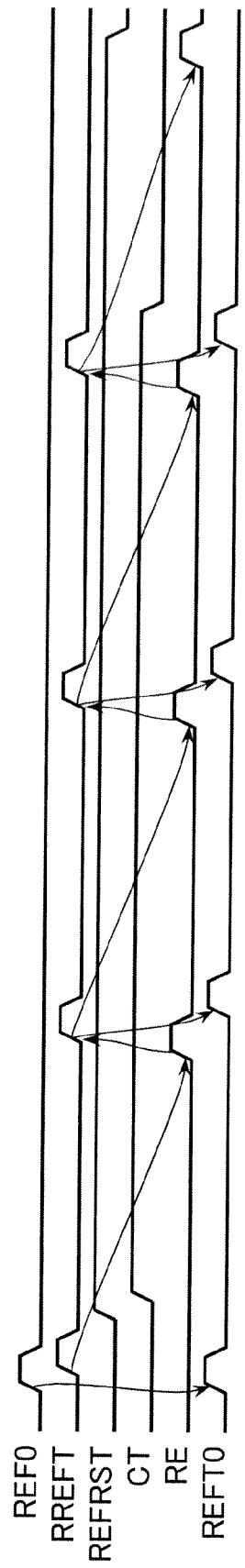
FIG. 18 is a timing chart for explaining an operation of the pulse generating circuit 100 shown in FIG. 14.

Turning to FIG. 18, in the pulse generating circuit 100, the SR latch circuit 140 is set in response to one refresh command REF0 and accordingly the internal signal RREFT is activated. Because the internal signal RREFT is input to the delay circuit 130 and fed back to the complex gate circuit 143 as the delay signal RE, the internal signal RREFT is activated plural times with a predetermined period as shown in FIG. 18. The internal signal RREFT is output as the refresh command REFT0 through the AND gate circuit 144 and the OR gate circuit 145. Therefore, the refresh command REFT0 is also activated with the predetermined period.

The number of times of activation of the internal signal RREFT are counted by the counter circuit 110, and the count signal CT changes to a low level at the fourth time. This prohibits the activation of the refresh command REFT0 based on the internal signal RREFT. The refresh state signal REFRST then changes to a low level, thereby resetting the SR latch circuit 140.

In this way, the pulse generating circuit 100 activates the refresh command REFT0 four times in response to one refresh command REF0. Among these refresh commands REFT0, the first one is caused by passage of the refresh command REF0 through the OR gate circuit 145, and the second to fourth ones are automatically generated by the complex gate circuit 143 and the delay circuit 130 connected in a loop.

Meanwhile, when the clock enable signal CKE0 changes to a low level, the self state signal SELFST0 is activated to a high level, which starts the oscillator 300. When the oscillator 300 starts, a self refresh pulse SELF01 is periodically generated and fed back to the pulse generating circuit 100. The fed-back self refresh pulse SELF01 sets the SR latch circuit 140 through the AND gate circuit 151 and the NOR gate circuit 141. In this way, when the clock enable signal CKE0 changes to a low level, the SR latch circuit 140 is periodically set.

The second pulse generating circuit 200 has the same circuit configuration and performs the same operation as those of the first pulse generating circuit 100 shown in FIG. 15 except that signals CKE1 and REF1 are input thereto instead of the signals CKE0 and REED and that signals REFT1 and SELFST1 are output therefrom instead of the signals REFT0 and SELFST0.

The address terminal 15 is a terminal to which an address signal ADD and a bank address signal BA are supplied, and the supplied address signal ADD and bank address signal BA are supplied to an address latch circuit 40 and a chip-address generating circuit 42 through an input buffer IB.

The chip-address generating circuit 42 extracts or generates a chip address SID based on parts of the supplied address signal ADD and bank address signal BA, and the chip select signals CS0B and CS1B. The chip address SID output from the chip-address generating circuit 42 is latched by a latch circuit 41 synchronously with the internal clock signal ICLK. The chip address SID latched by the latch circuit 41 is supplied to the core chips CC0 to CC7 in common through the TSV buffer 61, the through silicon via TSV, and the TSV buffer 62. The address latch circuit 40 latches another parts of the supplied address signal ADD and bank address signal BA synchronously with the internal clock signal ICLK and supplies the latched signals to the core chips CC0 to CC7 in common through the TSV buffer 61, the through silicon via TSV, and the TSV buffer 62.

Figures 19A, 19B:
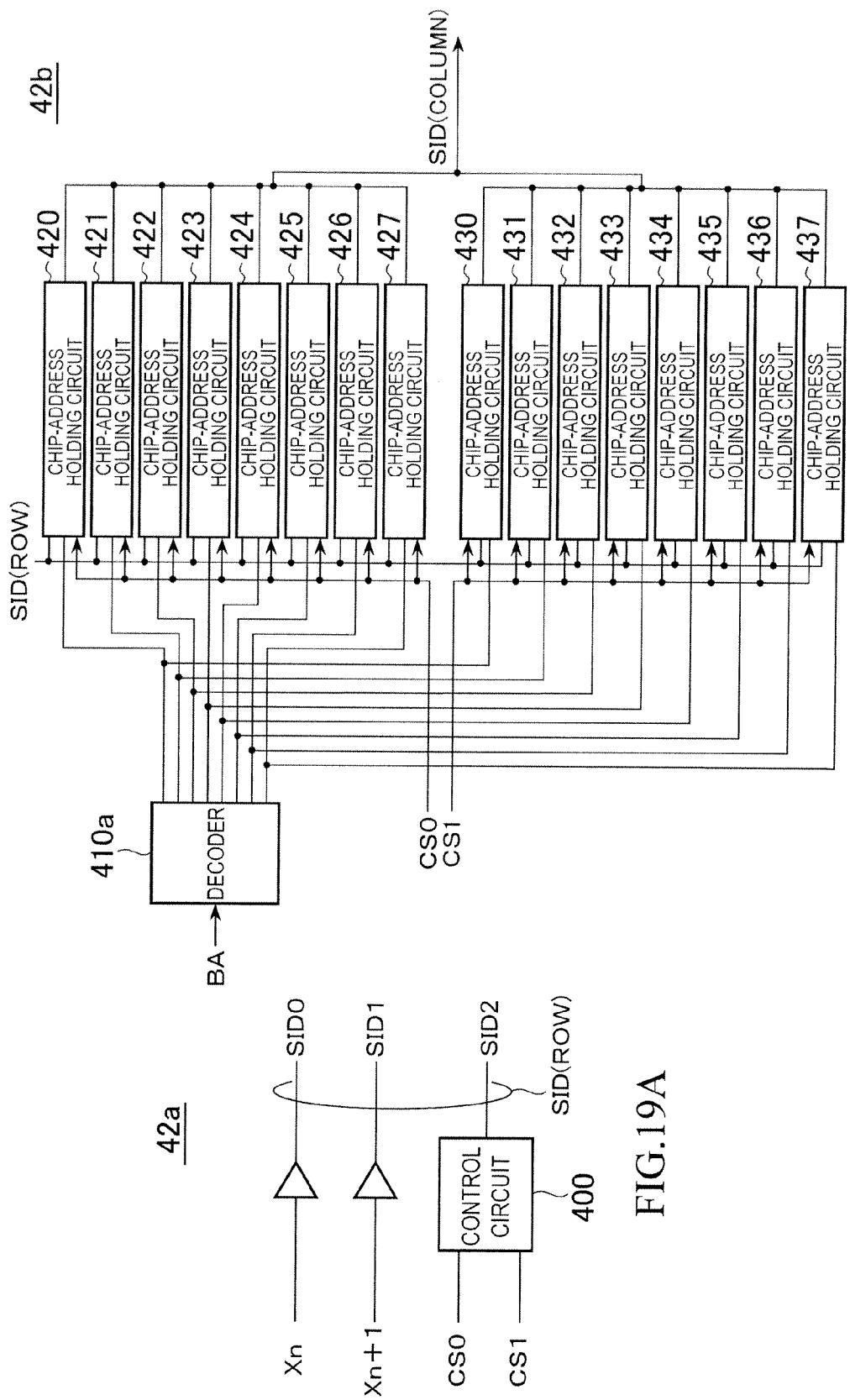

Turning to FIG. 19A, the circuit 42a that generates the chip address SID at the time of a row access generates the chip address SID based on two bits Xn and Xn+1 of a row address and the chip select signals CS0B and CS1B. Specifically, the circuit 42a outputs the bit Xn of the row address as it is as a bit SID0 of the chip address SID, outputs the bit Xn+1 of the row address as it is as a bit SID1 of the chip address SID, and generates a bit SID2 of the chip address SID based on the chip select signals CS0B and CS1B. The bit SID2 of the chip address SID is generated by a control circuit 400, and is set to a low level, for example, when the chip select signal CS0B (See CS0) is activated and is set to a high level, for example, when the chip select signal CS1B (See CS1) is activated. However, when the semiconductor device operates in modes other than the LRA-2 system, a bit Xn−1 of the row address is output as it is as the bit SID2 of the chip address SID.

Turning to FIG. 19B, the circuit 42b that generates the chip address SID at the time of a column access includes a decoder 410 that decodes the bank address signal BA and chip-address holding circuits 420 to 427 and 430 to 437 that hold chip addresses of respective banks. The decoder 410 selects one of the chip-address holding circuits 420 to 427 and one of the chip-address holding circuits 430 to 437 based on the bank address signal BA specified at the time of issuance of an active command ACT. The chip select signal CS0B is supplied to the chip-address holding circuits 420 to 427, and the chip select signal CS1B is supplied to the chip-address holding circuits 430 to 437. With this configuration, any one of the chip-address holding circuits is selected based on the bank address signal BA and the chip select signals CS0B and CS1B.

The selected chip-address holding circuit holds a chip address SID(ROW) specified at the time of issuance of the active command ACT. A chip address SID(COLUMN) can be obtained by reading the chip address based on the bank address signal BA and the chip select signals CS0B and CS1B supplied at the time of issuance of a column command, from the corresponding one of the chip-address holding circuits 420 to 427 and 430 or 437. The chip address SID (COLUMN) indicates one of the core chips CC0 to CC7 to be accessed at the time of issuance of the column command. The reason why the chip-address generating circuit 42 is used is because the chip address is not input at the time of issuance of the column command in the LRA system.

The chip address SID extracted or generated in this way is latched by the latch circuit 41 and then supplied to the core chips CC0 to CC7 in common through the through silicon via TSV1. Because the chip address is input also at the time of issuance of a column address in the PRA system, the chip address input at the time of issuance of the column address is transmitted as it is to the core chips CC0 to CC7 when the PRA system is selected.

The data input/output terminal 16 is a terminal for inputting or outputting read data DQ or write data DQ, and is connected to the output buffer circuit 51 and an input buffer circuit 52. The output buffer circuit 51 receives read data supplied through a parallel-serial converting circuit 54 and outputs the received read data to the data input/output terminal 16 synchronously with the output clock signal LCLK. The input buffer circuit 52 receives write data supplied through the data input/output terminal 16 and outputs the received write data to a serial-parallel converting circuit 55. An operation of the input buffer circuit 52 is performed synchronously with a data strobe signal DQS supplied through the data strobe terminal 17. The parallel-serial converting circuit (P/S) 54 converts parallel read data supplied from the core chips CC0 to CC7 through the through silicon vias TSV1 into serial data. The serial-parallel converting circuit (S/P) 55 converts serial write data supplied from the input buffer circuit 52 into parallel data.

In this way, parallel data which are not converted into serial data are basically input or output between the core chips CC0 to CC7 and the interface chip IF. That is, while data input/output to/from outside of the chip is performed serially (that is, one data input/output terminal is used for one data DQ) in the normal SDRAM that operates alone, data input/output is performed, in parallel between the core chips CC0 to CC7 and the interface chip IF. This point is an important difference between the normal SDRAM and the core chips CC0 to CC7. However, it is not essential to input/output prefetched parallel data using different through silicon vias TSV, respectively, and the number of through silicon vias TSV required for one data DQ can be reduced by performing partial parallel-serial conversion on the side of the core chips CC0 to CC7. For example, transfer of the read data or the write data between the interface chip IF and the core chips CC0 to CC7 can be performed in twice.

While the same through silicon vias TSV1 are used for the read data and the write data in the first embodiment, through silicon vias TSV1 dedicated for the read data and through silicon vias TSV1 dedicated for the write data can be also used. In this case, the read data and the write data are transmitted through different signal paths and thus no conflict of the read data and the write data between ranks occurs, which enables to further reduce an issuance interval of column commands.

The interface chip IF further includes a power-down control circuit 34. The power-down control circuit 34 activates power down commands PWDN0 and PWDN1 when the clock enable signals CKE0 and CEK1 are deactivated to a low level, respectively. As shown in FIG. 11, the power down commands PWDN0 and PWDN1 are also supplied to the core chips CC0 to CC7 in common through different through silicon vias TSV1. However, when the semiconductor device operates in modes other than the LRA-2 system, the chip select signal CS1B is not used and therefore the power down command PWDN1 is not used.

The interface chip IF further includes a mode register 60. Operation modes of the semiconductor device according to the first embodiment are set in the mode register 60. The operation modes to be set include also discrimination of the address allocation systems, that is, the LRA-1 system, the LRA-2 system, the LRA-3 system, and the PRA system. A mode signal MODE which is an output of the mode register 60 is supplied to various circuit blocks and is also supplied to the core chips CC0 to CC7 through the through silicon via TSV. For example, the input buffer 31 enables the chip select signal CS1B and the clock enable signal CKE1 when the mode signal MODE indicates the LRA-2 system, and disenables the chip select signal CS1B and the clock enable signal CKE1 when the mode signal MODE indicates systems other than the LRA-2 system. The chip-address generating circuit 42 extracts a different part of the address signal ADD according to the address allocation system indicated by the mode signal MODE, and generates the chip address based thereon.

The outline of the interface chip IF is as explained above. Circuit configurations of the core chips CC0 to CC7 are explained next.

Turning to FIG. 11, a memory cell array 70 included in each of the core chips CC0 to CC7 is divided into eight banks Bank0 to Bank7. In this explanation, a bank is a unit capable of individually receiving commands. In other words, each of the banks can operate independently of each other on a non-exclusive basis. In the memory cell array 70, a plurality of word lines WL and a plurality of bit lines BL intersect, and a memory cell MC is arranged at each intersection (only one word line WL, one bit line BL, and one memory cell MC are shown in FIG. 11). Selection of a word line WL is performed by a row decoder (XDEC) 71. The bit lines BL are connected to corresponding sense amplifiers in a sense circuit (SA) 72. Selection of a sense amplifier is performed by a column decoder (YDEC) 73.

A row address RA is supplied to the row decoder 71 through 5a row-address control circuit 74. To the row-address control circuit 74, the address signal ADD and the bank address signal BA are supplied through the through silicon via TSV1, and an active command ACT and a refresh command REF are also supplied from a row comparison circuit 500.

When the active command ACT is activated, the row-address control circuit 74 supplies the address signal ADD to the row decoder 71 of a bank selected based on the bank address signal BA. This activates a specified word line WL in the specified bank. That is, a row access is performed. On the other hand, when the refresh command REF is activated, the row-address control circuit 74 supplies a count value of a refresh counter (not shown) to the row decoders 71 of all the banks. This activates a specified word line in all the banks, thereby performing a refresh operation.

The row comparison circuit 500 also outputs precharge commands PRE and PREA. The precharge commands PRE and PREA are supplied to a precharge control circuit 77. The precharge control circuit 77 precharges a bank specified by the bank address signal BA when the precharge command PRE is activated, and precharges all the banks when the precharge command PREA is activated.

A column address CA is supplied to the column decoder 73 through a column-address control circuit 75. To the column-address control circuit 75, the address signal ADD and the bank address signal BA are supplied through the through silicon via TSV1, and the read command READ and the write command WRITE are also supplied from a column comparison circuit 600.

The column-address control circuit 75 supplies the address signal ADD to the column decoder 73 of a bank selected based on the bank address signal BA when the read command READ or the write command WRITE is activated. This connects a specified sense amplifier of the specified bank to a read/write amplifier 78. Therefore, when the read command READ is activated, read data that is read from the memory cell array 70 through the sense circuit 72 is transferred to the interface chip IF through the read/write amplifier 78 and the through silicon via TSV1. When the write command WRITE is activated, write data that is transferred from the interface chip IF through the through silicon via TSV1 is written in the memory cell array 70 through the read/write amplifier 78 and the sense circuit 72.

The row comparison circuit 500 compares a chip address SID(IF) supplied from the interface chip IF through the through silicon via TSV1 and a unique chip address SID (CORE) allocated to the corresponding one of the core chips CC0 to CC7 with each other, and activates the active command ACT, the refresh command REF, the precharge command PRE, or the precharge command PREA when both of the chip addresses coincide. The unique chip address SID (CORE) is held in a chip-address holding circuit 76. The chip-address holding circuits 76 are cascaded between the core chips CC0 to CC7 through the through silicon vias TSV2 of the type shown in FIG. 2B, which enables different chip addresses SID to be set in the respective core chips CC0 to CC7.

Figure 20:
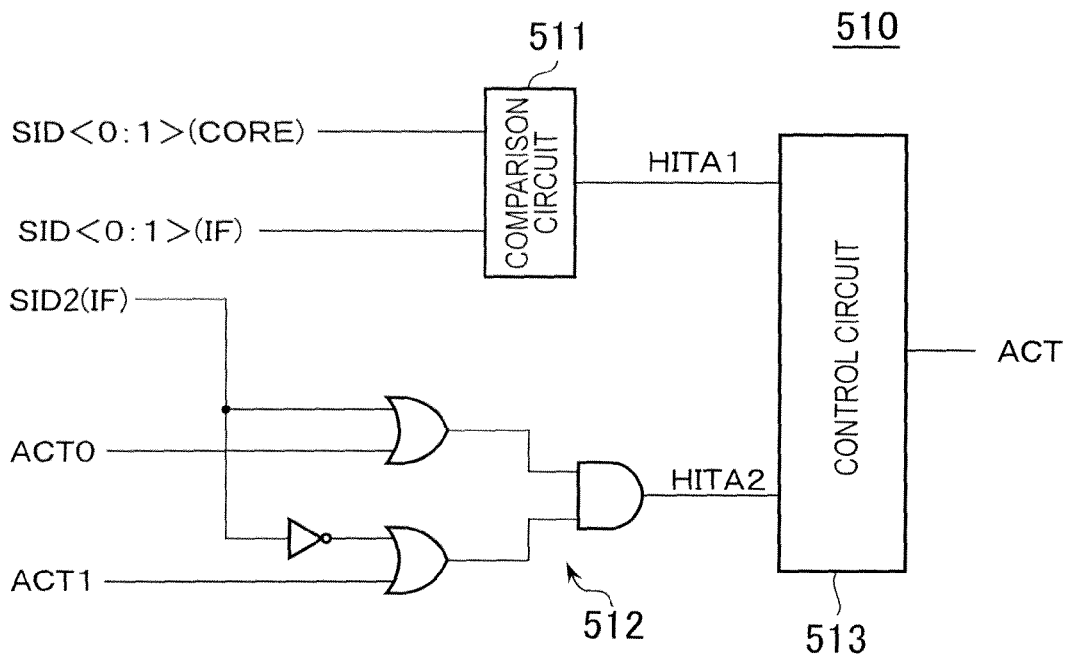
FIG. 20 is a circuit diagram indicative of an embodiment of a circuit block 510 that generates an active command ACT, among circuits included in a row comparison circuit 500 shown in FIG. 11.

Turning to FIG. 20, the circuit block 510 includes a comparison circuit 511, a logic circuit 512, and a control circuit 513. The comparison circuit 511 compares low two bits SID0, 1(IF) of the chip address supplied from the interface chip IF and low two bits SID0, 1(CORE) of the unique chip address allocated to the corresponding one of the core chips CC0 to CC7 with each other, and activates a hit signal HITA1 when both coincide. The logic circuit 512 selects one of the active commands ACT0 and ACT1 based on the most significant bit SID2(IF) of the chip address supplied from the interface chip IF. Specifically, when the chip address SID2(IF) is at a low level, the logic circuit 512 activates a hit signal HITA2 upon activation of the active command ACT0 to a high level, and when the chip address SID2(IF) is at a high level, the logic circuit 512 activates the hit signal HITA2 upon activation of the active command ACT1 to a high level. The control circuit 513 receives these hit signals HITA1 and HITA2, and activates the active command ACT when both of the hit signals are activated.

Figure 21:
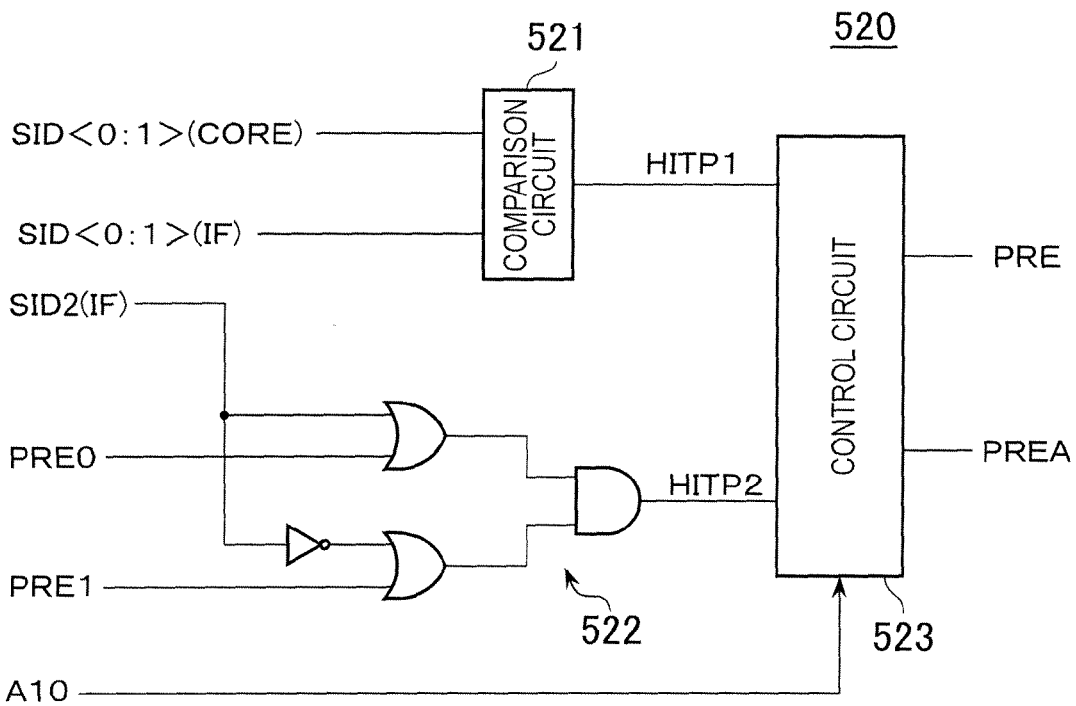
FIG. 21 is a circuit diagram indicative of an embodiment of a circuit block 520 that generates precharge commands PRE and PREA, among the circuits included in the row comparison circuit 500 shown in FIG. 11.

Turning to FIG. 21, the circuit block 520 includes a comparison circuit 521, a logic circuit 522, and a control circuit 523. The comparison circuit 521 compares the low two bits SID0, 1(IF) of the chip address supplied from the interface chip IF and the low two bits SID0, 1(CORE) of the unique chip address allocated to the corresponding one of the core chips CC0 to CC7 with each other, and activates a hit signal HITP1 when both coincide. The logic circuit 522 selects one of the precharge commands PRE0 and PRE1 based on the most significant bit SID2 (IF) of the chip address supplied from the interface chip IF. Specifically, when the chip address SID2(IF) is at a low level, the logic circuit 522 activates a hit signal HITP2 upon activation of the precharge command PRE0 to a high level, and when the chip address SID2(IF) is at a high level, the logic circuit 522 activates the high signal HITP2 upon activation of the precharge command PRE1 to a high level. The control circuit 523 receives these hit signals HITP1 and HITP2, and activates the precharge command PRE or PREA based on one bit A10 of the address signal ADD when both of the hit signals are activated. Specifically, the control circuit 523 activates the precharge command PRE when the bit A10 is at a low level and activates the precharge command PREA when the bit A10 is at a high level.

Figure 22:
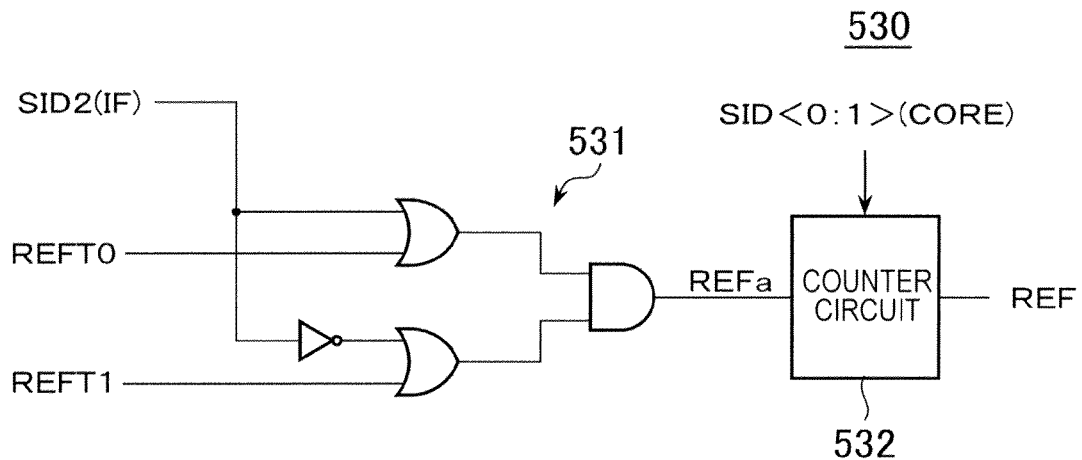
FIG. 22 is a circuit diagram indicative of an embodiment of a circuit block 530 that generates a refresh command REF, among the circuits included in the row comparison circuit 500 shown in FIG. 11.

Turning to FIG. 22, the circuit block 530 includes a logic circuit 531 and a counter circuit 532. The logic circuit 531 selects one of the refresh commands REFT0 and REFT1 based on the most significant bit SID2(IF) of the chip address supplied from the interface chip IF. Specifically, when the chip address SID2(IF) is at a low level, the logic circuit 531 activates a refresh command REFa upon activation of the refresh command REFT0 to a high level, and when the chip address SID2(IF) is at a high level, the logic circuit 531 activates the refresh command REFa upon activation of the refresh command REFT1 to a high level. The refresh command REFa is supplied to the counter circuit 532. The counter circuit 532 performs a count operation synchronously with the refresh command REFa, and outputs the refresh command REF when the count value coincides with the low two bits SID0, 1(CORE) of the unique chip address allocated to the corresponding one of the core chips CC0 to CC7. Because the refresh commands REFT0 and REFT1 are activated four successive times as described above, the refresh command REF is generated in a different core chip at each activation.

Figure 23:
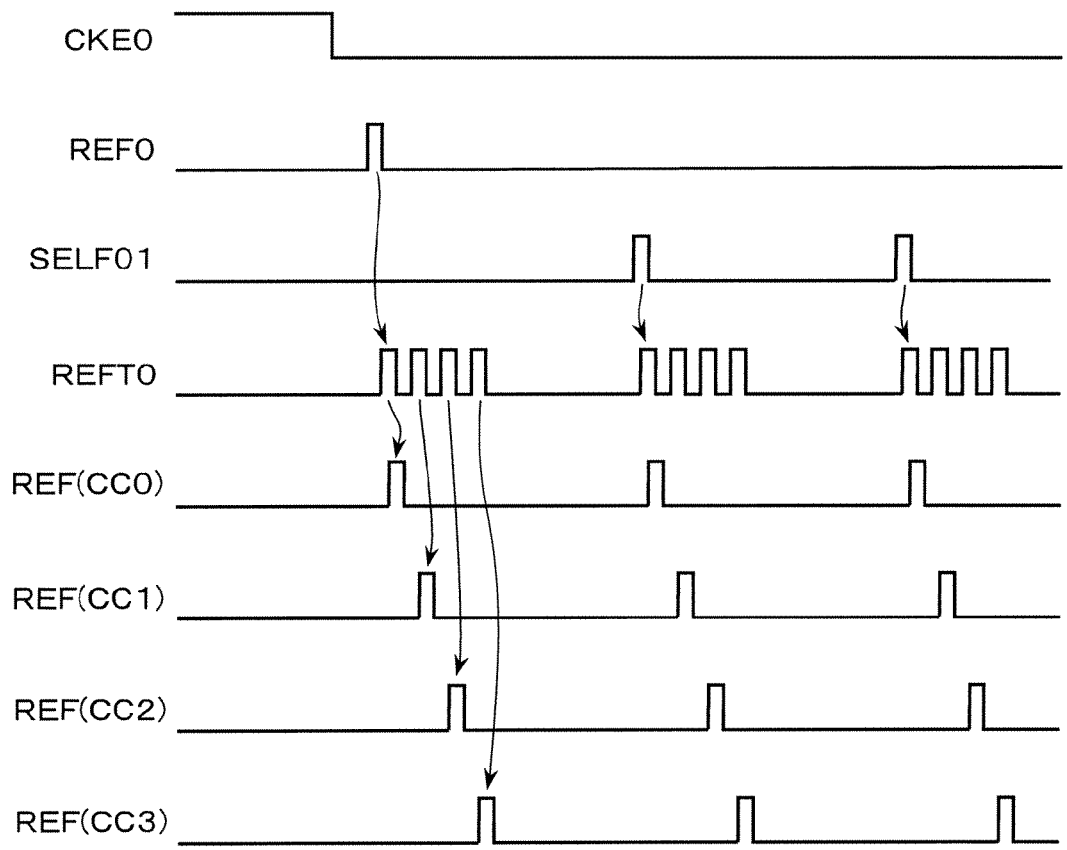
FIG. 23 is a timing chart for explaining a refresh operation of the semiconductor device 10 according to the first embodiment.

In an example shown in FIG. 23, the clock enable signal CKE0 changes from a high level to a low level, the refresh command REF0 is accordingly activated once, and then the semiconductor device 10 enters a self refresh mode. When the semiconductor device 10 enters the self refresh mode, the oscillator 300 is activated and thus the self refresh pulse SELF01 is periodically generated. When the refresh command REF0 or the self refresh pulse SELF01 is activated, the pulse generating circuit 100 shown in FIG. 15 generates the refresh command REFT0 four successive times.

The refresh command REFT0 is supplied to the core chips CC0 to C07 in common from the interface chip IF. However, the refresh command REFT0 is enabled only in core chips having the chip address SID2(IF) at a low level as shown in FIG. 22, that is, the core chips CC0 to CC3 that belong to the rank 0. Because the refresh command REF is generated in the core chips CC0 to CC3 synchronously with a pulse of each of the refresh commands REFT0 input four times, the core chips CC0 to CC3 perform the refresh operation in different timings. Accordingly, execution of the refresh operations is temporally dispersed and therefore peak current consumption is suppressed.

Referring back to FIG. 11, the column comparison circuit 600 compares the chip address SID(IF) supplied from the interface chip IF through the through silicon via TSV1 and the unique chip address SID(CORE) allocated to the corresponding one of the core chips CC0 to CC7 with each other, and activates the read command READ or the write command WRITE when both of the chip addresses coincide. Specifically, when the chip address SID(IF) and the chip address SID(CORE) coincide, the column comparison circuit 600 causes the read command READ or the write command WRITE supplied from the interface chip IF to pass through as it is to supply the command to the column-address control circuit 75 and the read/write amplifier 78.

Each of the core chips CC0 to CC7 also includes a power down circuit 610. The power down circuit 610 causes the corresponding core chip to enter a power down mode based on the chip address SID(IF), the chip address SID(CORE), and the power down commands PWDN0 and PWDN1. Specifically, the power down circuit 610 has the same circuit configuration as that of the logic circuit 531 shown in FIG. 22, and when the chip address SID2(IF) is at a low level, the power down circuit 610 causes the corresponding core chip to enter the power down mode upon activation of the power down command PWDN0 to a high level, and when the chip address SID2(IF) is at a high level, the power down circuit 610 causes the corresponding core chip to enter the power down mode upon activation of the power down command PWDN1 to a high level.

The circuit configurations of the core chips CC0 to CC7 are as explained above.

With the configuration described above, when the LRA-2 system is selected, the row commands (the active command, the precharge command, and the refresh command) and the power down command are supplied from the interface chip IF to the core chips CC0 to CC7 through different through silicon vias TSV1 with respect to each rank. On the other hand, the column commands (the read command and the write command) are supplied from the interface chip IF to the core chips CC0 to CC7 through the through silicon vias TSV1 common to the ranks.

The reason why the above configuration is adopted is as follows. When a memory controller issues commands to a memory module including plural ranks, the row commands and the power down command may be issued successively in one clock cycle (tRRD=1) and, if the commands are transferred through the through silicon via TSV1 common to the ranks, a transfer interval of the commands on the through silicon via is reduced, which leads to a risk of preventing the commands from being properly transferred. In the first embodiment, to avoid the risk, the different through silicon vias TSV1 are allocated to the row commands and the power down command with respect to each rank. On the other hand, as for the column commands, a minimum issuance interval (tCCD) is limited to a four clock cycle, for example, in the standards to prevent competition between the read data or the write data on a data bus and therefore the column commands are not issued successively in one clock cycle. Accordingly, the column commands are transferred by using the through silicon vias TSV1 common to the ranks to reduce the number of through silicon vias TSV1.

Figure 24:
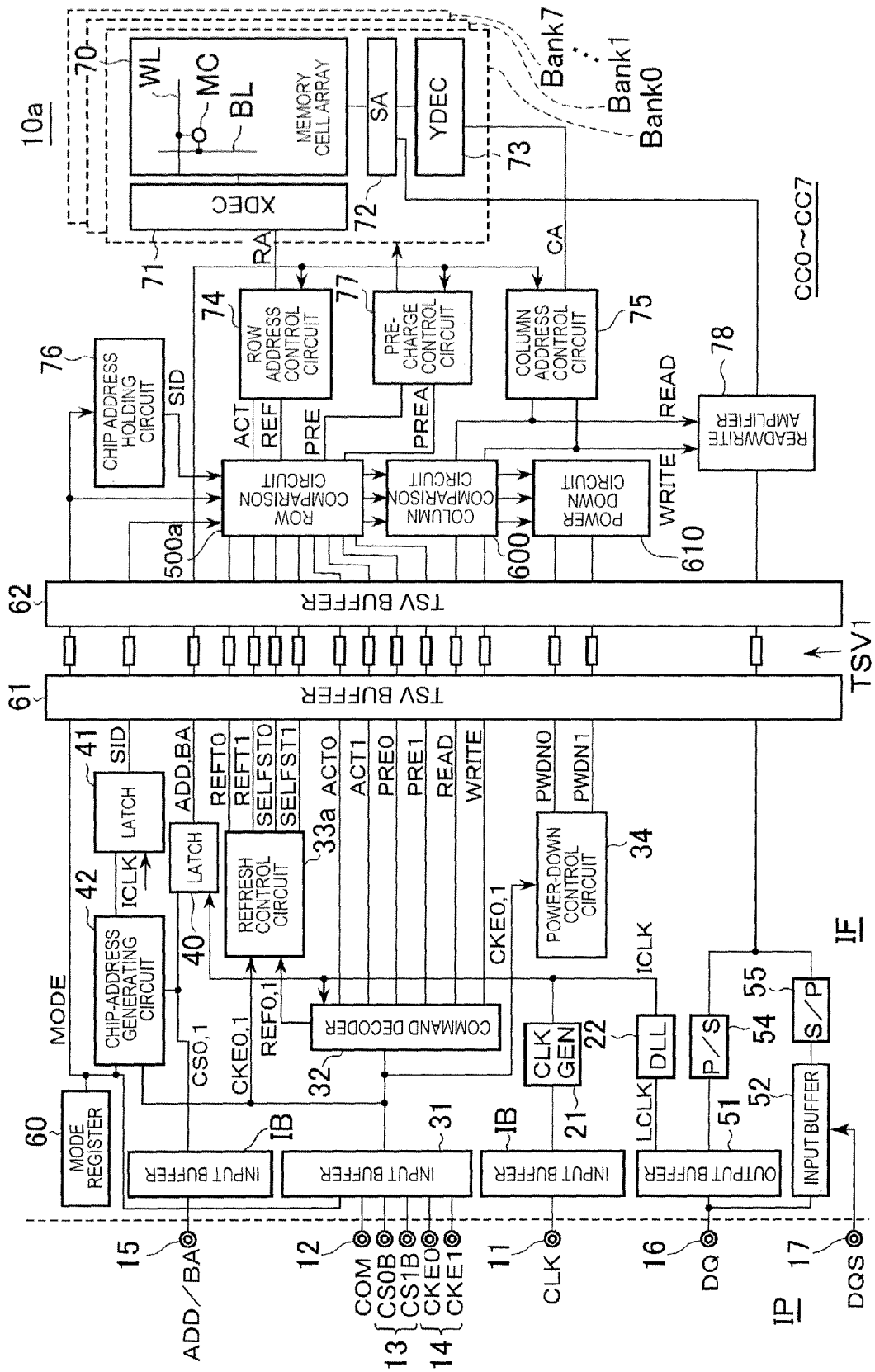
FIG. 24 is a block diagram indicative of an embodiment of a configuration of a semiconductor device 10a according to a second embodiment of the present invention.

Turning to FIG. 24, the semiconductor device 10a according to the second embodiment is different from the semiconductor device 10 according to the first embodiment in circuit blocks related to the refresh operation. Specifically, the semiconductor device 10a is different from the semiconductor device 10 according to the first embodiment in that the refresh control circuit 33 included in the interface chip IF is replaced by a refresh control circuit 33a, and the row comparison circuit 500 included in each of the core chips CC0 to CC7 is replaced by a row comparison circuit 500a. Other configurations of the semiconductor device 10a according to the second embodiment are identical to those of the semiconductor device 10 according to the first embodiment, and therefore like constituent elements are denoted by like reference numerals and redundant explanations thereof will be omitted.

Figure 25:
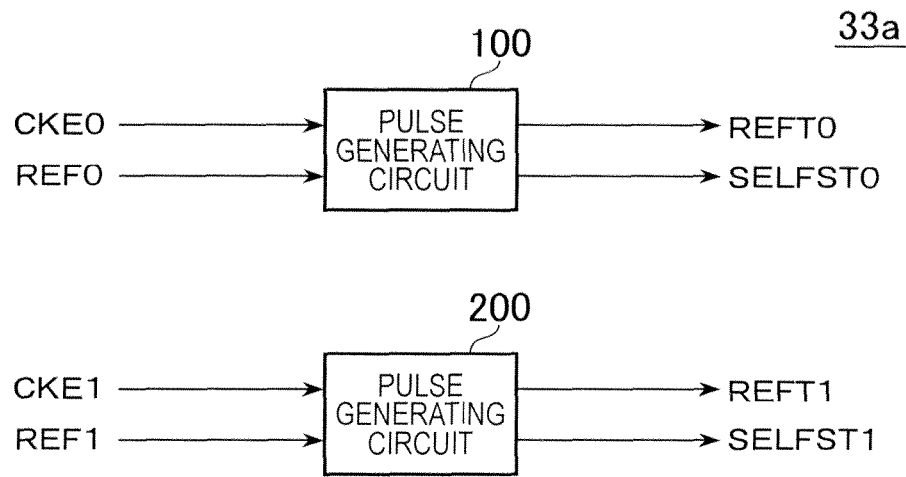
FIG. 25 is a block diagram indicative of an embodiment of a refresh control circuit 33a shown in FIG. 24.

Turning to FIG. 25, the refresh control circuit 33a includes the first pulse generating circuit 100 and the second pulse generating circuit 200. The pulse generating circuits 100 and 200 have the circuit configurations as explained with reference to FIG. 15. Therefore, the first pulse generating circuit 100 generates the refresh command REFT0 and the self state signal SELFST0 based on the clock enable signal CKE0 and the refresh command REF0. Similarly, the second pulse generating circuit 200 generates the refresh command REFT1 and the self state signal SELFST1 based on the clock enable signal CKE1 and the refresh command REF1. These signals are transferred from the interface chip IF to the core chips CC0 to CC7 through the through silicon vias TSV1.

Figure 26:
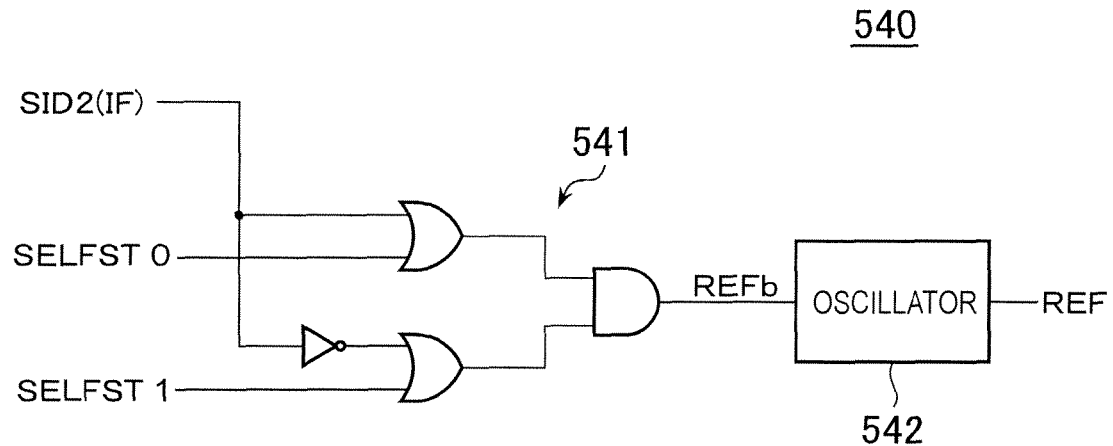
FIG. 26 is a circuit diagram indicative of an embodiment of a circuit block 540 that generates the refresh command REF, among circuits included in a row comparison circuit 500a shown in FIG. 24.

Turning to FIG. 26, the circuit diagram of the circuit block 540 included in the row comparison circuit 500a is shown. The row comparison circuit 500a also includes the circuit blocks 510, 520, and 530 shown in FIGS. 20 to 22.

As shown in FIG. 26, the circuit block 540 includes a logic circuit 541 and an oscillator 542. The logic circuit 541 selects one of the self state signals SELFST0 and SELFST1 based on the most significant bit SID2 (IF) of the chip address supplied from the interface chip IF. Specifically, when the chip address SID2(IF) is at a low level, the logic circuit 541 activates a refresh command REFb upon activation of the self state signal SELFST0 to a high level, and when the chip address SID2(IF) is at a high level, the logic circuit 541 activates the refresh command REFb upon activation of the self state signal SELFST1 to a high level. The refresh command REFb is supplied to the oscillator 542. The oscillator 542 is started by the refresh command REFb, and when the oscillator 542 starts, the refresh command REF is periodically generated.

As described above, the oscillator 542 is provided on the side of the core chips in the second embodiment, so that adjustment of an oscillator period according to temperatures can be performed with respect to each core chip. Accordingly, the self refresh operation can be performed in a period most appropriate to each core chip.

Figure 27:
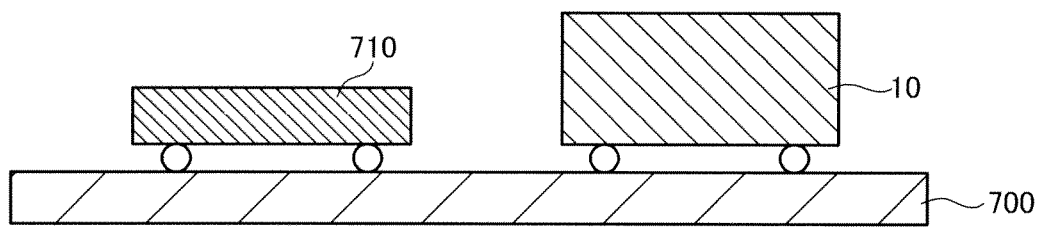
FIG. 27 is a schematic cross-sectional view of a configuration of a data processing system using the semiconductor device 10 according to the first embodiment.

Turning to FIG. 27, the data processing system has a configuration in which the semiconductor device 10 and a memory controller 710 that controls the semiconductor device 10 are mounted on a main substrate 700. While the semiconductor device 10 is directly mounted on the main substrate 700 in an example shown in FIG. 27, it is possible that a socket is provided on the main substrate 700 and a module substrate having the semiconductor device 10 mounted thereon is plugged into the socket. In this case, a plurality of the semiconductor devices 10 can be mounted on the module substrate.

It is apparent that the present invention is not limited to the above embodiments, but may be modified and changed without departing from the scope and spirit of the invention.

What is claimed is:

1. A semiconductor device comprising:
   first and second chips stacked to each other, each of the first and second chips including first, second and third penetration electrodes penetrating therethrough; and
   a third chip to control the first and second chips, and stacked on the first and second chips, and the third chip including first, second and third output circuits,
   wherein the first output circuit is coupled to the first penetration electrodes to supply a first command signal to the first chip,
   the second output circuit is coupled to the second penetration electrodes to supply the first command signal to the second chip, and
   the third output circuit is coupled to the third penetration electrodes to supply a second command signal to the first and second chips;
   and wherein the third chip further includes:
   a clock enable terminal to which first and second clock enable signals are supplied from outside;
   an oscillator that periodically generates a self refresh pulse when the first and second clock enable signals indicate deactivation of at least one of the first and second chips;
   a first pulse generating circuit that outputs the self refresh pulse to the first and second chips when the first clock enable signal indicates deactivation of the first chip; and
   a second pulse generating circuit that outputs the self refresh pulse to the first and second chips when the second clock enable signal indicates deactivation of the second chip,
   the first chip includes a first refresh circuit that performs a refresh operation based on the self refresh pulse supplied from the first pulse generating circuit, and
   the second chip includes a second refresh circuit that performs a refresh operation based on the self refresh pulse supplied from the second pulse generating circuit.

2. The semiconductor device as claimed in claim 1, wherein
   the third chip further includes a chip select terminal to which a chip select signal is supplied from outside of the semiconductor device, the third chip activates the first and third output circuits when the chip select signal selects the first chip, and the third chip activates the second and third output circuits when the chip select signal selects the second chip.

3. The semiconductor device as claimed in claim 2, wherein the third chip further includes a command terminal to which a command signal is supplied from outside, the third chip activates the first output circuit when the command signal indicates an active command and the chip select signal selects the first chip, and the third chip activates the second output circuit when the command signal indicates the active command and the chip select signal selects the second chip.

4. The semiconductor device as claimed in claim 3, wherein the third chip activates the first output circuit when the command signal indicates a precharge command and the chip select signal selects the first chip, and the third chip activates the second output circuit when the command signal indicates the precharge command and the chip select signal selects the second chip.

5. The semiconductor device as claimed in claim 3, wherein the third chip activates the first output circuit when the command signal indicates a refresh command and the chip select signal selects the first chip, and the third chip activates the second output circuit when the command signal indicates the refresh command and the chip select signal selects the second chip.

6. The semiconductor device as claimed in claim 3, wherein the third chip activates the third output circuit when the command signal indicates a read command or a write command, regardless of which one of the first and second chips is selected by the chip select signal.

7. The semiconductor device as claimed in claim 1, wherein the first chip includes a first comparison circuit that receives the first command supplied from the first output circuit, and the second chip includes a second comparison circuit that receives the first command supplied from the second output circuit.

8. The semiconductor device as claimed in claim 1, wherein:

the first and second chips perform a refresh operation at different timings from each other, the first output circuit supplies a first command signal only to the first chip, the second output circuit supplies the first command signal only to the second chip, and the third output circuit supplies a second command signal to both the first and second chips.

9. The semiconductor device as claimed in claim 1, wherein:

the first and second chips each comprise a back-end unit including a memory core, the third chip comprises an interface unit including a common front-end unit for the first and second chips, and external accesses, inputs, and outputs are performed through the third chip to the first and second chips.

10. A semiconductor device comprising:

a first chip configured to receive first and second chip select signals and an original command signal, and output both of first and second command signals, the first command signal being activated when both of the original command signal and the first chip select signal are activated, and the second command signal being activated when the original command signal and the second chip select signal are activated; and a plurality of chips stacked with one another on the first chip, the plurality of chips including second and third chips, the second chip being activated when the second chip receives an activated first command signal from the first chip, and the third chip being activated when the third chip receives an activated second command signal from the first chip, wherein the first chip includes first, second and third driver circuits, the first driver circuit is coupled to first penetration electrodes to supply the first command signal to the second chip, the second driver circuit is coupled to second penetration electrodes to supply the first command signal to the third chip, and the third driver circuit is coupled to third penetration electrodes to supply the second command signal to the second and third chips.

11. The semiconductor device as claimed in the claim 10, wherein the first chip select signal is activated when the second chip select signal is inactivated and the second chip select signal is activated when the first chip select signal is inactivated.

12. The semiconductor device as claimed in claim 10, wherein each of the second and third chips include the first and second penetration electrodes each penetrating a chip substrate thereof, the first and second penetration electrodes of the second chip being electrically coupled to those of the third chip, respectively, and the first and second command signals being respectively transferred from the first chip to each of the second and third chips through the first and second penetration electrodes.

13. The semiconductor device as claimed in claim 12, wherein the first and second chips respectively have first and second identification data different from each other, the first identification data deauthorizing the activated second command signal to keep the second chip an inactive state even if the second chip receives the activated second command signal, and the second identification data deauthorizing the activated first command signal to keep the third chip an inactive state even if the third chip receives the activated first command signal.

14. The semiconductor device as claimed in claim 10, wherein the second and third chips respectively include a plurality of memory cells, the memory cells in each of the second and third chips being accessed by row and column accesses, the second and third chips performing the row access in response to the activated first and second command signals, respectively.

15. The semiconductor device as claimed in claim 14, wherein the first chip is further configured to output a third command signal, the third command signal being activated when either one of the first and second chip select signal is activated, the second and third chips respectively performing the column access in response to an activated third command signal.

16. A semiconductor device comprising:

a first chip configured to receive first and second chip select signals and an original command signal, and output both of first and second command signals, the first command signal being activated when both of the original command signal and the first chip select signal are activated, and the second command signal being activated when the original command signal and the second chip select signal are activated, the third chip including first and second driver circuits; and a plurality of chips stacked with one another on the first chip, the plurality of chips including second and third chips, the second chip being activated when the second chip receives an activated first command signal from the first chip, and the third chip being activated when the third chip receives an activated second command signal from the first chip, the second chip including first penetration electrodes penetrating therethrough, and the third chip including second penetration electrodes penetrating therethrough, wherein the first driver circuit is coupled to the first penetration electrodes to supply the first command signal to the second chip, and the second driver circuit is coupled to the second penetration electrodes to supply the first command signal to the third chip.

* * * * *